(12) United States Patent
Nakaya et al.

(10) Patent No.: US 7,609,572 B2
(45) Date of Patent: Oct. 27, 2009

(54) SEMICONDUCTOR MEMORY DEVICE

(75) Inventors: Hiroaki Nakaya, Kokubunji (JP);
Riichiro Takemura, Tokyo (JP); Satoru Akiyama, Sagamihara (JP); Tomonori Sekiguchi, Tama (JP); Masayuki Nakamura, Tokyo (JP); Shinichi Miyatake, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 113 days.

(21) Appl. No.: 11/963,831

(22) Filed: Dec. 22, 2007

(65) Prior Publication Data
US 2008/0181026 A1 Jul. 31, 2008

(30) Foreign Application Priority Data
Jan. 31, 2007 (JP) ............................. 2007-020986

(51) Int. Cl.
*G11C 7/00* (2006.01)
(52) U.S. Cl. .................. 365/205; 365/208; 365/104
(58) Field of Classification Search .................. 365/205, 365/208, 104, 191, 51, 63, 230.06, 189.09, 365/189.03
See application file for complete search history.

(56) References Cited

U.S. PATENT DOCUMENTS

| 5,875,141 | A | * | 2/1999 | Shirley et al. ............... 365/207 |
| 6,212,110 | B1 | | 4/2001 | Sakamoto et al. |
| 7,177,215 | B2 | * | 2/2007 | Tanaka et al. ............... 365/203 |

FOREIGN PATENT DOCUMENTS

| JP | 06-243683 A | 9/1994 |
| JP | 11-265571 A | 9/1999 |
| JP | 2000-187985 A | 7/2000 |
| JP | 2003-168294 A | 6/2003 |

* cited by examiner

*Primary Examiner*—Dang T Nguyen
(74) *Attorney, Agent, or Firm*—Miles & Stockbridge P.C.

(57) ABSTRACT

In a semiconductor memory device, with respect to low voltage application, technique of controlling a gate voltage of a shared MOS transistor increasing sense speed and increasing data read speed by preventing data inversion caused by noise and reducing bit line capacitance during sensing is provided. By a shared MOS transistor gate voltage control circuit connecting a sense amplifier and a memory cell array, a shared MOS transistor gate voltage (SHR) is lowered in two stages and bit line capacitance to be amplified is reduced taking noise during the sensing into consideration so that the sense speed is increased. Therefore, a timing of activating a column selection signal can be hastened and as a result, data read time can be reduced.

20 Claims, 21 Drawing Sheets

SEMICONDUCTOR MEMORY DEVICE

CROSS-REFERENCE TO RELATED APPLICATION

The present application claims priority from Japanese Patent Application No. JP 2007-020986 filed on Jan. 31, 2007, the content of which is hereby incorporated by reference into this application.

TECHNICAL FIELD OF THE INVENTION

The present invention relates to a semiconductor memory device, in particular to technique of controlling a semiconductor memory device effective in speed-up of amplification of a signal read from a cell of the semiconductor memory device.

BACKGROUND OF THE INVENTION

According to study of the present inventors, as for technique of controlling a semiconductor memory device, following technique is considered.

For example, a dynamic random access memory (hereinafter referred to as "DRAM"), which is one of a semiconductor memory device, is mounted in great numbers on various electronic equipments used by us in daily life. And, with needs for lower power consumption and higher performance of equipments in recent years, higher performance such as lower power, higher speed and larger capacity are also strongly demanded for a DRAM mounted.

One of the most effective means for realizing a high performance DRAM is miniaturization of memory cells. By miniaturizing processing dimensions, the memory cells can be smaller. As a result, length of a word line and a bit line connected to the memory cells are reduced. That is, parasitic capacitance of the word lines and the bit lines can be reduced, and therefore, low voltage operation becomes possible and lower power consumption can be realized. Furthermore, since the memory cells become smaller, larger capacity of the memory is obtained and higher performance of the equipment can be realized. Thus, miniaturization of processing dimensions contributes greatly to higher performance of the DRAM.

However, demands for low voltage operation of the DRAM memory cell array is increasing year by year with miniaturization of the processing dimension of semiconductor process to 65 nm and 45 nm nodes and lower power consumption of the DRAM. Accordingly, a voltage applied to the bit line of the DRAM is lowered. In a case where a half pre-charge system is adopted for a sense amplifier of the DRAM, when microscopic data stored in the bit line capacitor is amplified, voltages on a gate of a NMOS transistor and a PMOS transistor of the sense amplifier are also lowered. Therefore, time for amplification of data by the sense amplifier increases and there is a possibility that operation specifications of the DRAM cannot be satisfied. So, unless a voltage applied on each MOS transistor of the sense amplifier is increased or a threshold voltage of the MOS transistor is lowered so as to ensure an execution voltage applied on the gate, bit line capacitance amplified by the sense amplifier must be reduced using a shared MOS (hereinafter referred to as "SHRMOS") transistor provided between the sense amplifier and the bit line.

As technique of controlling a gate voltage of the SHRMOS transistor as described above, technique disclosed in Japanese Patent Application Laid-Open Publication No. 6-243683 (Patent Document 1) exists. In Patent document 1, technique improving sense speed by controlling the gate voltage of the SHRMOS transistor is disclosed. By controlling the gate voltage of the SHRMOS transistor, the bit line capacitance amplified by the sense amplifier is reduced and the sense speed is improved. And, in re-coupling of the sense amplifier and the memory cell array, lowering of a bit line voltage in a High level side bit at re-coupling can be suppressed by gradually raising the gate voltage of the SHRMOS transistor.

SUMMARY OF THE INVENTION

Note that, as a result of review about aforementioned technique of the semiconductor device by the present inventors, following points are revealed.

For example, Patent Document 1 discloses a system in which electrical conduction of the SHRMOS transistor is controlled, amplification of read data from the memory cell is speed-up, an activation timing of a column selection signal is hastened, and therefore, read operation of data is speed-up. In the system of Patent Document 1, in order to reduce data amplifying time in the sense amplifier, the SHRMOS transistor is turned OFF after activation of the sense amplifier and connection of the sense amplifier and the memory cell array is disconnected so that the bit line capacitance amplified by the sense amplifier is reduced.

However, in this system, since the gate voltage of the SHRMOS transistor only controls electrical conduction, there is a problem that data might be inverted because of noise received by the bit line in the sense amplifier from surrounding. A great amount of noise sources such as an adjacent bit line coupling capacitance or cross couple offset by variation of a threshold voltage of the MOS transistor exists around the sense amplifier of the DRAM, and if the sense amplifier and the memory cell array are completely separated, an amount of noise received by the bit line in the sense amplifier is increased, and therefore, there is a possibility that data is destroyed.

In view of the above problems, an object of the present invention is to provide a controlling technique realizing a semiconductor memory device having tolerance against the noise received by the amplifier from surrounding, controlling the gate voltage of the SHRMOS transistor and improving the sense speed.

The above and other objects and novel characteristics of the present invention will be apparent from the description of this specification and the accompanying drawings.

The typical ones of the inventions disclosed in this application will be briefly described as follows.

That is, the semiconductor memory device according to the present invention controls the gate voltage of the SHRMOS transistor connecting the sense amplifier and the memory cell array while taking noise into consideration.

Because of this control, the sense speed can be increased while preventing data inversion by surrounding noise of the sense amplifier. That is, the data-read time can be reduced by increasing the sense speed without changing a configuration of the sense amplifier circuit.

The effects obtained by typical aspects of the present invention will be briefly described below.

The semiconductor memory device achieving both suppression of lowering of the sense speed and noise tolerance can be realized.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that the same components are denoted by the same reference symbols throughout the drawings for describing the embodiment, and the repetitive description thereof will be omitted.

And, transistors configuring each block shown in embodiments of the present invention are, although not particularly limited, formed over one semiconductor substrate such as single crystal silicon by integrated circuit technique such as a known CMOS (Complementary MOS transistor) and the like. That is, the transistors are formed through steps including a step of forming a first and a second semiconductor region configuring a gate electrode and a source-drain region after a step of forming a well, an isolation region and an oxide film.

As for a circuit symbol of a MOSFET (Metal Oxide Semiconductor Field Effect Transistor), one having an arrow directed inward with respect to a gate represents an N-type MOSFET (NMOS) and is distinguished from that of a P-type MOSFET (PMOS) having an arrow directed outward with respect to a gate. Hereinafter, a MOSFET is simplified as "a MOS" or "a MOS transistor".

Note that, the present invention is not limited only to a field effect transistor including an oxide film provided between a metal gate and a semiconductor layer, and is also applied to a circuit using a general FET such as a MISFET (Metal Insulator Semiconductor Field Effect Transistor) including an insulation film therebetween and the like. Note that, in following description, the MOS transistor includes the MISFET.

First Embodiment

A semiconductor memory device according to one example of the present invention is described below using FIGS. 1 to 4 and FIGS. 19 to 24.

In a present proposed system, operation of dropping a gate voltage of a SHRMOS transistor from VPP to an intermediate potential in two stages of V1 and V2 by a sense amplifier activation signal SAN and returning the gate voltage of the SHRMOS transistor to VPP again at a falling edge of a column selection signal YS is performed. By this operation, the sense speed can be higher and read of data can be faster while reducing noise.

Figure 19:
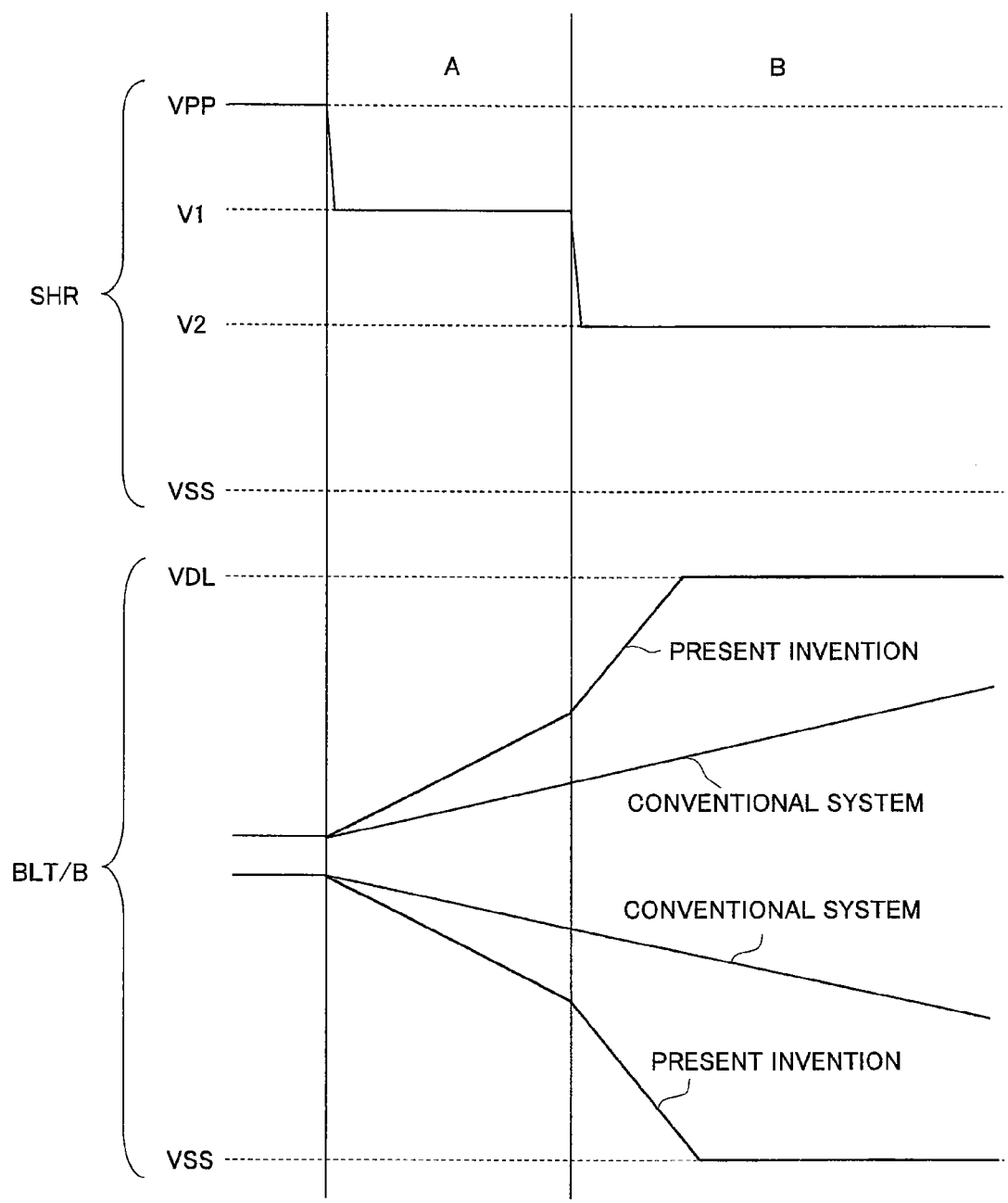
FIG. 19 is a waveform diagram showing an operation example of a gate voltage of a SHRMOS transistor and a bit line applied with the SHRMOS transistor gate voltage 4-value control circuit in the semiconductor memory device according to the first embodiment of the present invention.

FIG. 19 is an example of operation waveform diagram of the gate voltage (SHR) of the SHRMOS transistor SHR and the bit line voltages (BLT/BLB) in a case where the present proposed system is adopted. In the present invention, as described above, the SHR is dropped to the intermediate potential in two stages of V1 (region A) and V2 (region B) in order to realize lower noise and higher sense speed. Effects in respective regions are described below.

In the region A, a problem of noise which is a problem in a conventional system of controlling the gate voltage of the SHRMOS transistor is solved, and the sense speed is increased.

Figure 20:
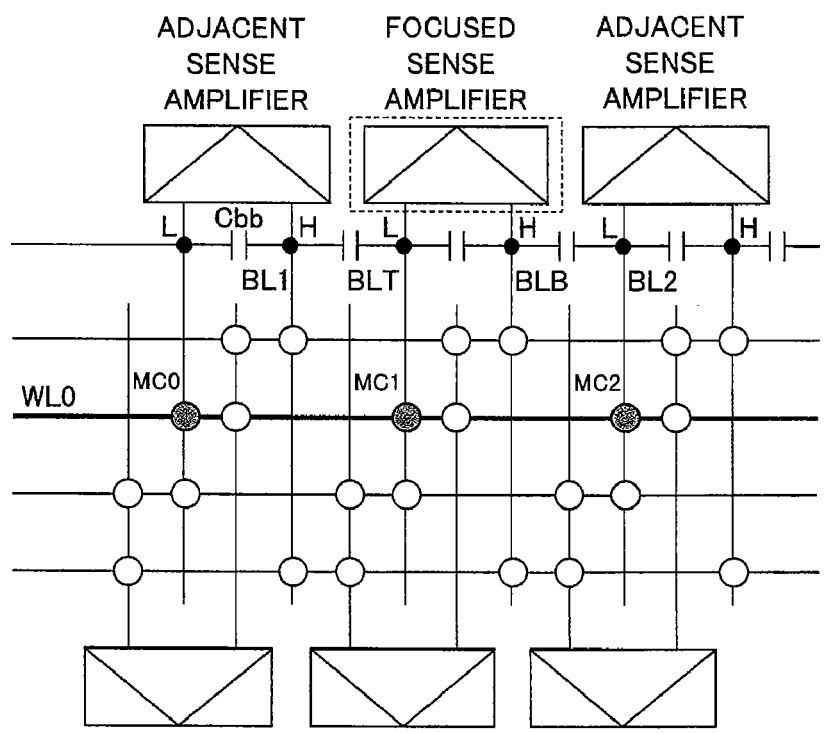
FIG. 20 is a diagram showing a memory cell array configuration in the semiconductor memory device according to the first and the second embodiments of the present invention.
Figure 21:
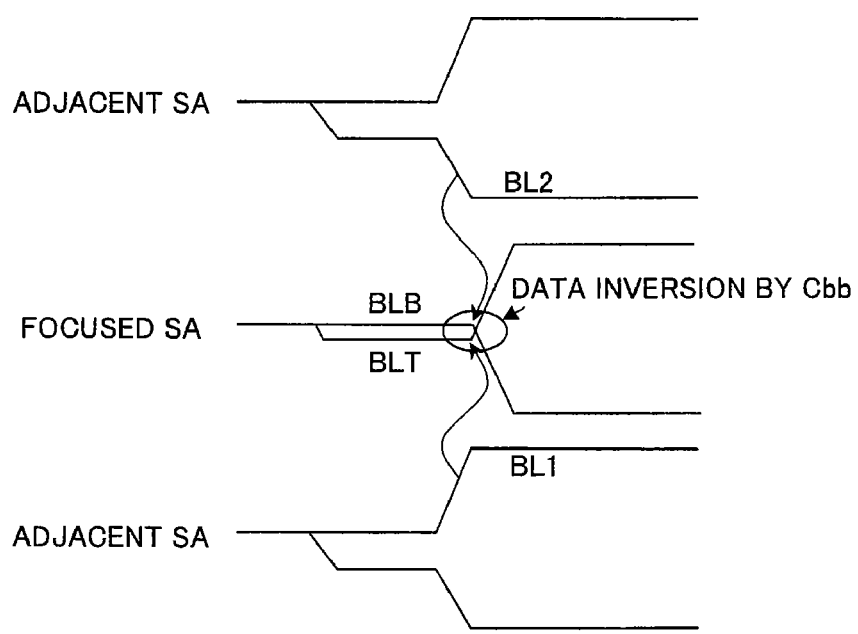
FIG. 21 is a waveform diagram showing one example of data inversion by adjacent bit lines in the semiconductor memory device according to the first and the second embodiments of the present invention.

The problem of the conventional system is briefly described. FIG. 20 shows a memory cell array configuration, and FIG. 21 shows an example of a waveform diagram of data inversion by adjacent bit lines. A control method lowering the gate voltage of the SHRMOS transistor to VSS and completely disconnecting the sense amplifier and the memory cell array to increase the sense speed as described in Patent Document 1 has a problem that noise tolerance thereof is weak. Now, it is assumed that a word line WL0 of FIG. 20 is selected, and cell data of MC0, MC1, MC2 on a word line WL0 are 'L' (Low level). In this case, a BLT of a focused sense amplifier surrounded by a broken line is 'L' and a BLB is 'H' (High level), and, data of an adjacent bit line BL1 of BLT is 'H' and an adjacent bit line BL2 of BLB is 'L'. Then, as shown in FIG. 21, in a case where an amount of signal of data 'L' read by the focused sense amplifier is small, there is a possibility that data of the focused sense amplifier inverts or the sense speed becomes extremely slow due to noise generated by capacitance Cbb between adjacent bit lines shown in FIG. 20 when potential of adjacent bit lines BL1, BL2 transit. This is because the bit line capacitance is reduced and the noise tolerance degrades by disconnecting the sense amplifier and the memory cell array by the SHR.

Figure 22:
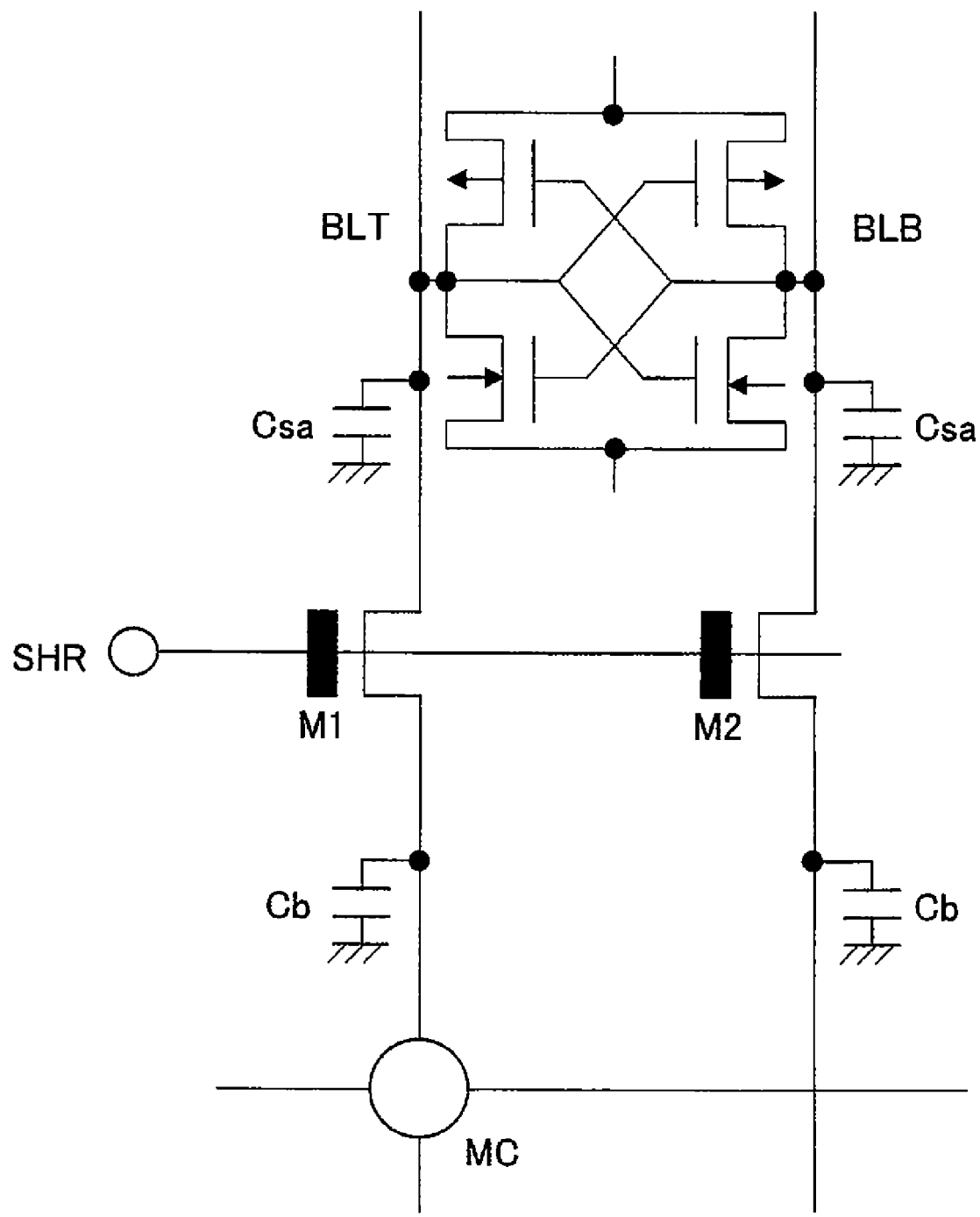
FIG. 22 is a diagram showing a part of a focused sense amplifier shown in FIG. 20, a SHRMOS transistor and a memory cell connected thereto.

Here, a brief explanation of the noise is provided. For example, as shown in FIG. 22, if it is assumed that the bit line capacitance in the sense amplifier is Csa, the bit line capacitance in a memory cell array side is Cb and an amount of a voltage change of the adjacent bit line BL1 is $\delta Va$, the noise received by the BLT is expressed by the following equation.

$$[Cbb/(Csa+Cbb+Cb)] \cdot \delta Va \qquad (1)$$

In the conventional system, since the gate voltage of the SHRMOS transistor is lowered to VSS and the memory cell array is completely disconnected, the bit line capacitance in the memory cell array side Cb viewed from the sense amplifier is 0. Therefore, a problem that the noise becomes greater exists. Conventionally, an amount of the read signal is large and the problem is not matter, however, with progress of a lower voltage, the amount of the read signal amount is decreased and it is no longer negligible.

In the region A of FIG. 19, the sense speed is increased while suppressing noise. Instead of dropping the gate voltage of the SHRMOS transistor to VSS at once as in the conventional art, the gate voltage is first dropped to V1. As the gate voltage of the SHRMOS transistor SHR is lowered, a term of Cb of the equation (1) becomes smaller. That is, the noise becomes larger. "The noise becomes a problem" means that an amount of the signal read to the sense amplifier is small, an amount of the noise exceeds the amount of the signal read and data inversion or lowering in the sense speed occurs. Therefore, the intermediate potential V1 is set to a position where the noise does not exceed the amount of the signal read. Thus, the sense speed can be increased to a certain extent without causing data inversion. After amplification is performed until the bit line amplitude exceeds the mount of noise, the state transits from the region A to the region B.

In the region B, the gate voltage of the SHRMOS transistor is lowered from V1 to V2, and the sense speed is accelerated at once. Since amplification is already performed in the region A until amplitude in which data inversion by noise does not occur, the gate voltage of the SHRMOS transistor can be lowered to a level of V2 at which the transistor is barely turned OFF. Thus, the sense amplifier and the memory cell array are disconnected, and therefore, the bit line capacitance to be amplified becomes lighter as much and the sense speed becomes higher. By setting to the intermediate potential V2 in the present example instead of lowering to VSS as in the conventional system, power consumed in re-coupling of the sense amplifier and the memory cell array can be reduced.

Here, a brief explanation of the power consumed in re-coupling of the sense amplifier and the memory cell array is provided. For example, if it is assumed that the number of MAT selected per one BANK is A, the number of SHRMOS transistors controlled in the MAT is B, wiring load capacitance of a gate voltage control line of the SHRMOS transistor is C and a read cycle is tRC, consumption current is expressed by the following equation.

$$A \cdot B \cdot C \cdot [(Vpp-V2/tRC] \qquad (2)$$

From this equation, it is recognized that the lower the intermediate potential V2 becomes, the more the consumption current increases. Since the system of the present invention lowers the gate voltage of the SHRMOS transistor only to the intermediate potential V2 instead of to VSS as in the conventional system, the consumption current can be reduced.

Figure 1:
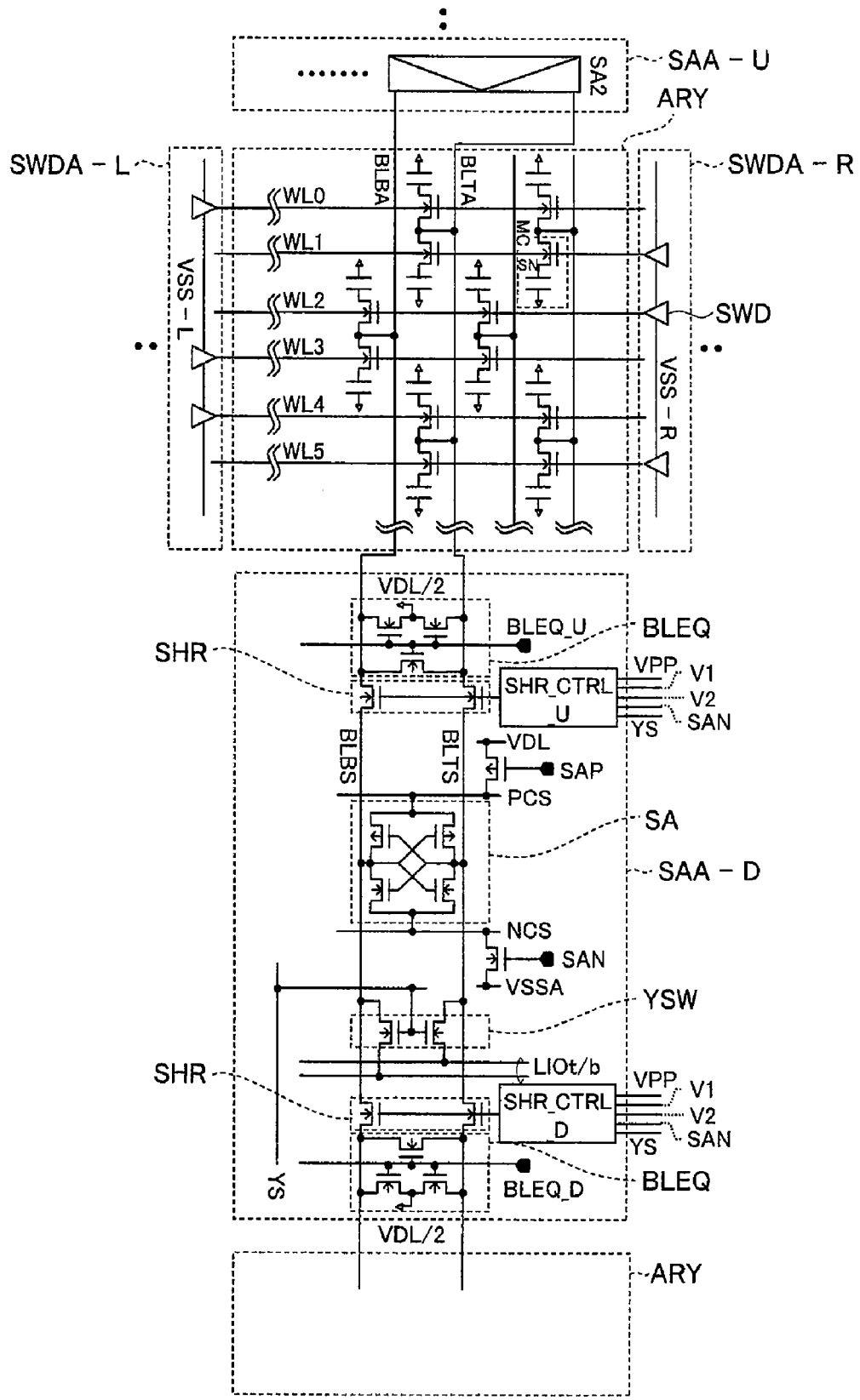
FIG. 1 is a diagram showing an arrangement example of a SHRMOS transistor gate voltage 4-value control circuit in a semiconductor memory device according to a first embodiment of the present invention.

FIG. 1 shows a memory cell array ARY and a sense amplifier array SAA. The memory cell array ARY is composed of a plurality of memory cells MCs. A DRAM cell is composed of one MOS transistor and one capacitor, one of a source terminal and a drain terminal of the MOS transistor is connected to the bit line, the other of the source terminal and the drain terminal is connected to a storage node SN and a gate terminal is connected to a word line. One of terminals of the capacitor is connected to the storage node SN and the other terminal of the capacitor is connected to ground.

The sense amplifier array SAA has a plurality of sense amplifiers SAs arranged and is connected to the bit lines of the memory cell arrays on both sides. The SHRMOS transistor SHR is a transistor controlling connection/non-connection of the sense amplifier array SAA and the memory cell array ARY. Normally, only connection/non-connection is controlled as described above, but in the present proposed system, SHRMOS transistor gate voltage control circuits (SHR_CTRL_U/SHR_CTRL_D) are provided and performing fine control of the gate voltage of the SHRAMOS transistor.

A pre-charge circuit BLEQ equalizes between bit lines forming a pair when a pre-charge signal (BLEQ) is activated, and performs pre-charge to a bit line pre-charge level. The bit line pre-charge level is normally set to a middle point VDL/2 of the bit line amplitude voltage VDL (a same level as or a level dropped from the power source voltage VDD from outside of a chip).

The sense amplifier (a cross couple amplifier) SA is a circuit driving a PMOS side common source line PCS to VDL, driving a NMOS side common source line NCS to VSS, amplifying one of bit lines BLT and BLB having a higher voltage to VDL and amplifying the other one having a lower voltage to VSS after a microscopic read signal from the memory cell is generated on the bit line. The local IO lines LIOt/b and the bit line pair BLT/BLB are connected when the column selection signal YS is activated. A LIO is pre-charged to VBLR during standby to prevent current consumption at a non-selected sense amplifier array.

Figure 2:
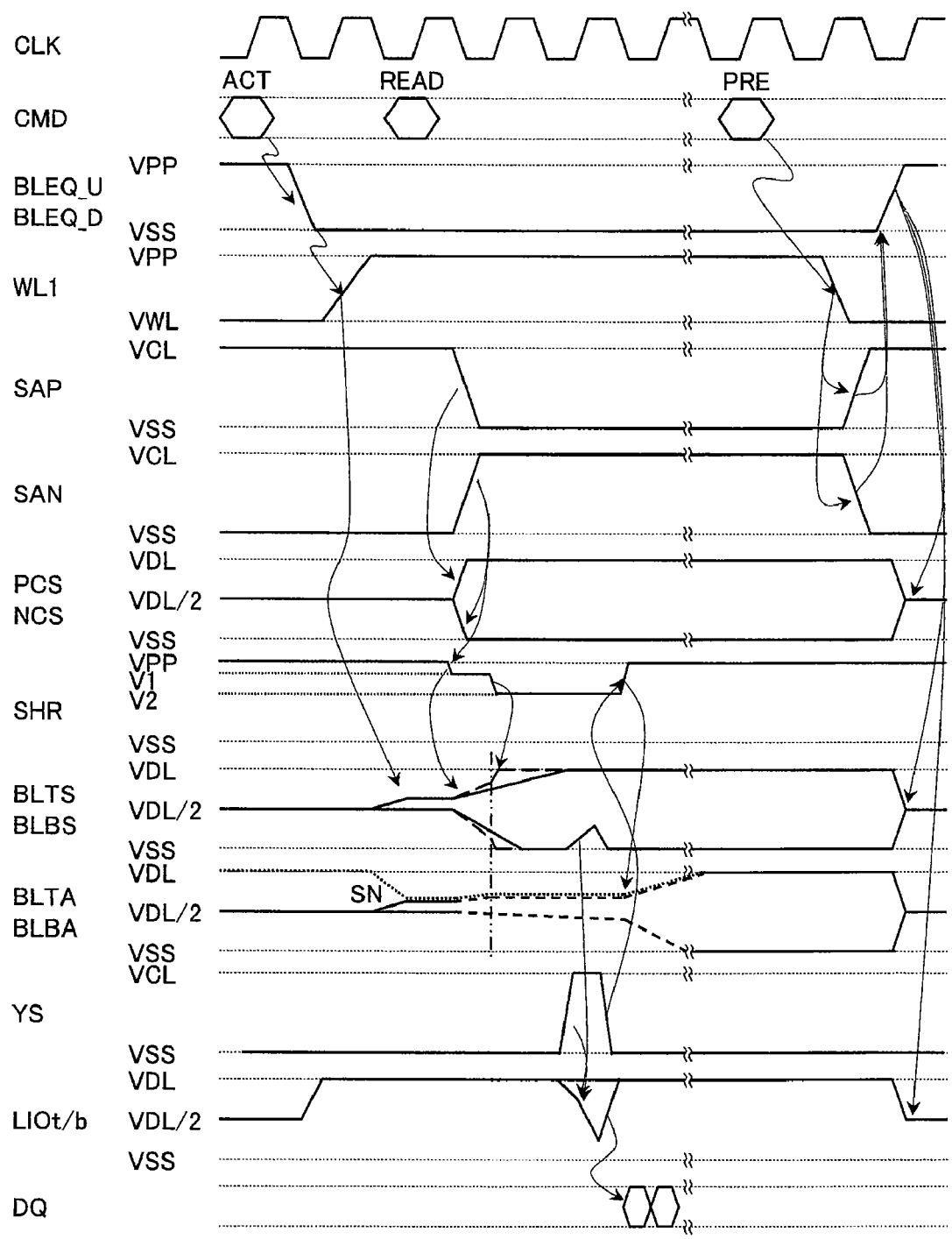
FIG. 2 is a waveform diagram showing a read operation example of a synchronous DRAM applied with the SHRMOS transistor gate voltage 4-value control circuit in the semiconductor memory device according to the first embodiment of the present invention.

Operation of the memory cell array is described using FIG. 2. FIG. 2 is an example of a read operation waveform diagram of the semiconductor memory device applied with the present invention. When an active command ACT is inputted together with a row address, the address is decoded inside. Thereby, bit line pre-charge signals BLEQ_U, BLEQ_D transit to an inactivated state in a sense amplifier block of the corresponding address. Here, since the pre-charge circuit BLEQ is configured by NMOS, the transition is performed from a high potential level of an activated state, for example, a word line boosting power source VPP or the bit line amplitude voltage VDL to a ground level VSS. Therefore, the pre-charge of the bit line of the corresponding memory cell array stops.

Next, a word line WL corresponding to the inputted address is selected. Here, the selected word line activates one word line connected to one memory cell, for example, WL1 in FIG. 1. The word line WL1 to be activated transits from a word line standby level VWL to a word line selection level (the word line boosting power source VPP). Accordingly, in the memory cell MC, the gate of the transistor transits to a selected state, the storage node SN and the bit line are connected and data of the memory cell is read to the bit line. Here, a case in which data of 'H' is stored in the memory cell storage node SN is described. In this case, the bit line has a voltage higher than the pre-charge level as much as charges accumulated in the storage node SN.

After a predetermined period elapsed since the word line is activated, the NMOS sense amplifier activation signal SAN transits from the ground level VSS of a non-selected state to the high potential VDL in the activated state or the word line boosting power source VPP and a NMOS cross couple of the sense amplifier SA is activated. At this time, the SHRMOS transistor gate voltage control circuit operates and transits the SHR voltage from VPP to the intermediate potential V1. And then, after certain time elapsed, the voltage is transited from V1 to V2. Thus, the sense speed is increased in two stages while securing noise tolerance, as described above.

At substantially the same time as or delayed from the SAN, a PMOS sense amplifier activation signal SAP transits from the high potential state VCL of the non-selected state or the word line boosting power source VPP to the ground level VSS of the activated state and the PMOS cross couple of the sense amplifier SA is activated. Thus, a microscopic signal voltage generated in the bit line is amplified to the bit line amplitude voltage VDL. A column command input waiting state is then obtained in this state. The actual column command can be inputted at the same time as or before the bit line amplitude becomes sufficient amplitude.

Here, an example in which a read command READ is inputted from outside is described. A column address desired to be read is inputted at the same time as the read command READ. When the read command is inputted, the column selection signal YS from a column decoder transits from the ground level VSS of the standby state to the high potential VCL (the bit line amplitude voltage VDL or the like) in the selected state according to the address inputted simultaneously and the activated state is obtained. Thus, the data held in the sense amplifier SA is read to the local IO line LIOt/b. And, when the column selection signal YS transits from the high potential VCL (the bit line amplitude voltage VDL or the like) of the selected state to the ground level VSS of the standby state, the SHRMOS transistor gate voltage control circuit operates and transits the gate voltage of the SHRMOS transistor from the intermediate potential V2 to VPP.

And then, although not shown in diagrams, the data is outputted to outside through a main amplifier and an input/output unit.

Next, operation in a case where a pre-charge command PRE is inputted is described. If the pre-charge command is inputted in the command input waiting state, a selected word line transits to the word line standby level VWL of the non-selected state. Accordingly, the sense amplifier activation signals SAN, SAP transit to the non-selected state. After the sense amplifier transits to the inactivated state, the bit line pre-charge signals BLEQ_U, BLEQ_D transit to the activated state and all of bit lines and reference bit lines of the activated memory cell array ARY are set to the bit line pre-charge level. In FIG. 2, the bit line pre-charge level is set to VDL/2 which is ½ of the bit line amplitude voltage. Then, the pre-charge operation is completed.

Figure 3:
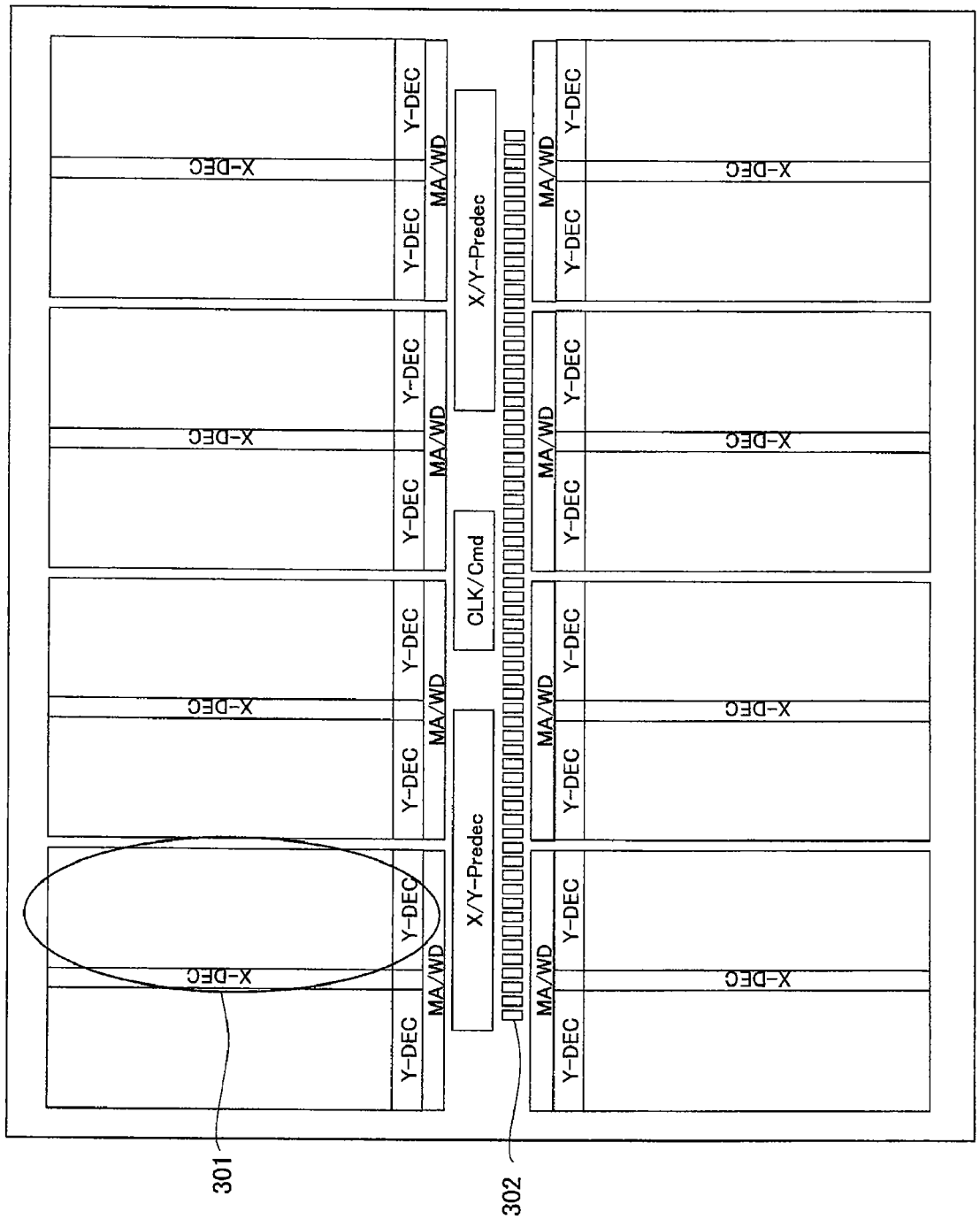
FIG. 3 is a diagram showing an entire DRAM chip in the semiconductor memory device according to the first embodiment of the present invention.

FIG. 3 is a diagram showing an entire configuration of a chip of the DRAM. The DRAM chip is broadly divided to a control circuit (X/Y-Predec, CLK/Cmd), a memory block 301, and an input/output PAD 302. To the control circuit (X/Y-Predec, CLK/Cmd), a clock, an address, and a control signal are inputted from outside of the chip, and determination of chip operation mode and pre-decoding of the address are performed. To the input/output PAD 302, write data is inputted from outside of the chip and the input/output PAD 302 outputs read data to outside of the chip.

Figure 4:
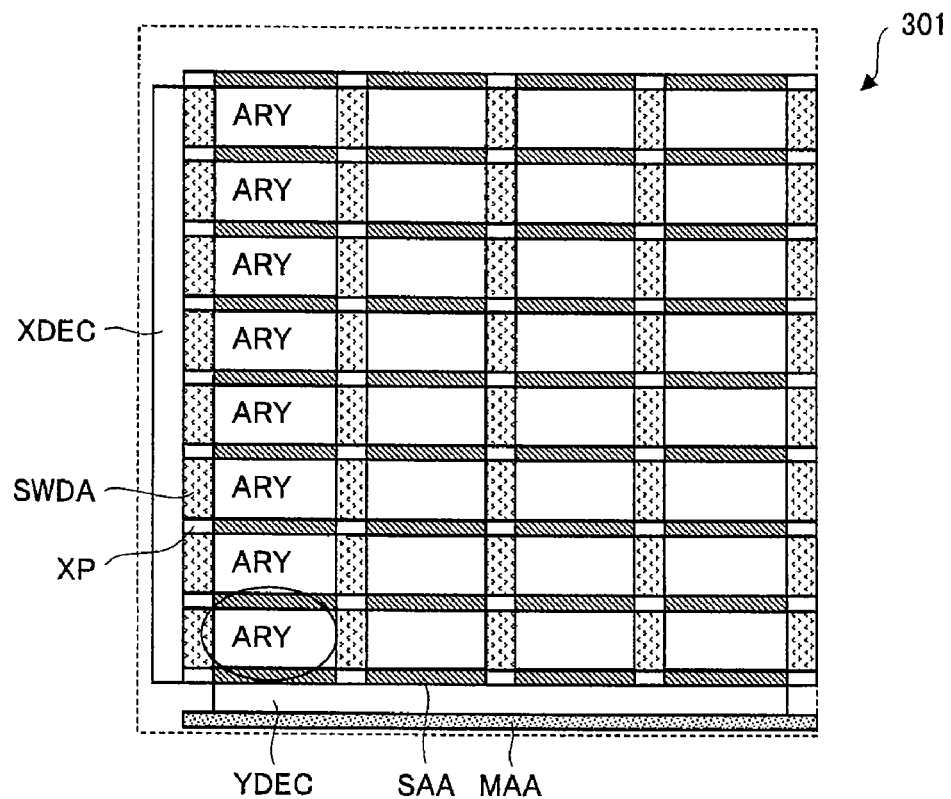
FIG. 4 is a diagram showing a DRAM block in the semiconductor memory device according to the first embodiment of the present invention.

A configuration of the memory block 301 is shown in FIG. 4. In the memory block, a plurality of memory cell arrays ARY is arranged in an array form, and a sense amplifier array SAA, a sub-word driver array SWDA and a cross area XP are arranged at a periphery thereof. And, a column decoder YDEC and a main amplifier array MAA are arranged on an outer periphery of the block, and a row decoder XDEC is arranged parallel to a sub-word driver array SWDA.

Figure 5:
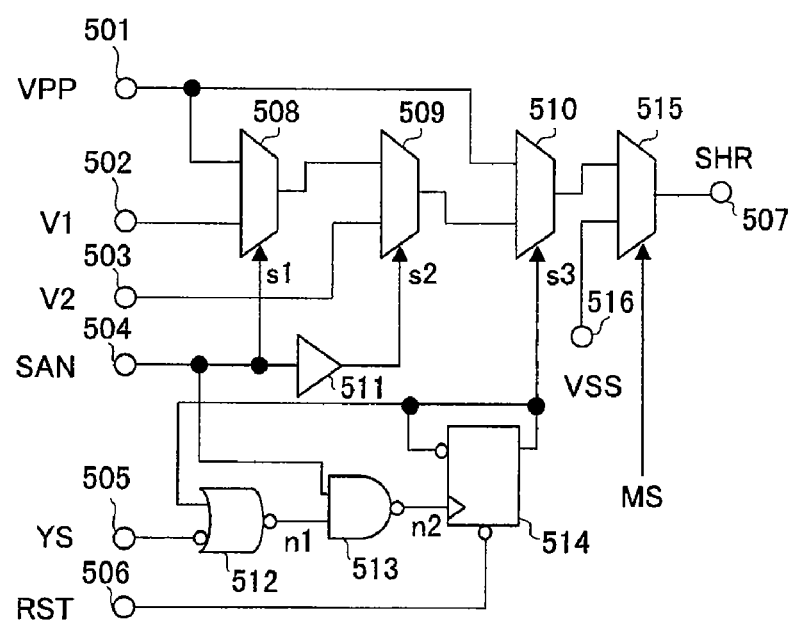
FIG. 5 is a block diagram showing the SHRMOS transistor gate voltage 4-value control circuit in the semiconductor memory device according to the first embodiment of the present invention.

FIG. 5 is a detailed circuit block diagram showing one example of the SHRMOS transistor gate voltage control circuits (SHR_CTRL_U, SHR_CTRL_D). This circuit is composed of a 4-stage selector (508, 509, 510, 515), a delay circuit 511, an inverter NOR 512, a NAND 513 and a D flip-flop (DFF) 514.

The word line boosting power source VPP is connected to a node 501, and an intermediate potentials (V1, V2) between the VPP and the ground level VSS are connected to nodes 502, 503. The sense amplifier activation signal SAN is inputted to a node 504, the column selection signal (YS) is inputted to a node 505 and a reset signal (RST) is inputted to a node 506.

A selector 508 is controlled by the SAN, switches the node 501 and the node 502 and outputs. The selector 509 having an output of the selector 508 as one of inputs is controlled by a selection signal s2 obtained by passing the SAN through the delay circuit 511, switches the output of the selector 508 and the node 503 and outputs. The selector 510 having an output of the selector 509 as one of inputs is controlled by an output s3 of the DFF 514, switches the output of the selector 509 and the node 501 and outputs. The selector 515 having an output of the selector 510 as one of inputs is controlled by a MAT selection signal (MS), switches the output of the selector 510 and the node 516 and outputs. And, the output s3 of the DFF 514 is also connected to one terminal of the inverter NOR. To the DFF 514, an output n2 of the NAND 513 is inputted as a clock and the DFF 514 outputs data. To the NAND 513, the SAN is inputted to one of inputs, and an output n1 of the inverter NOR is inputted to the other input. To one of inputs of the invert NOR 512, the output s3 of the DFF 514 is inputted as described above, and the YS is inputted to the other input.

Figure 6:
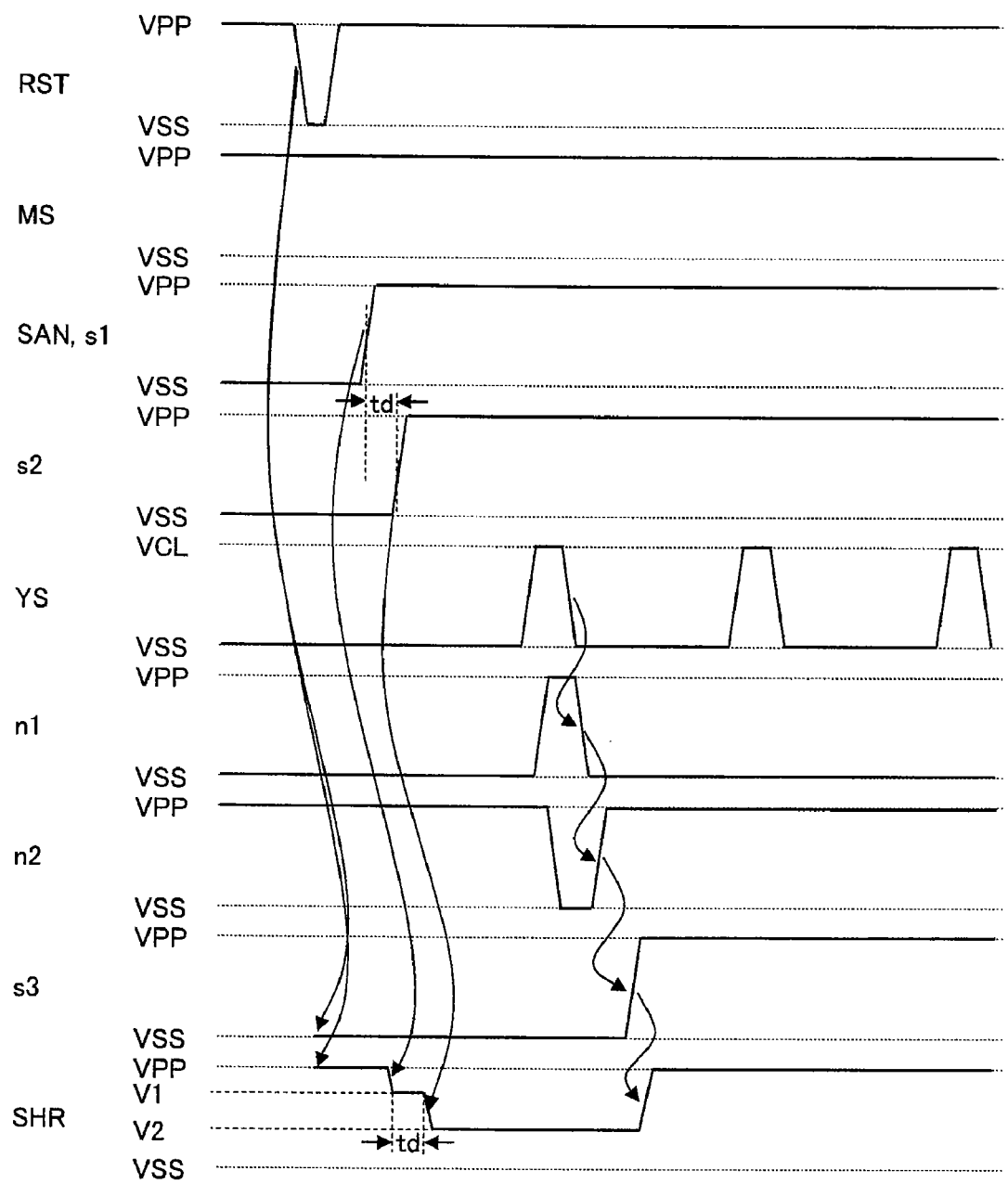
FIG. 6 is a waveform diagram showing an operation example of the SHRMOS transistor gate voltage 4-value control circuit in the semiconductor memory device according to the first embodiment of the present invention.

Operation of the circuit of FIG. 5 is described using a timing chart of FIG. 6. First, the SAN inputted to the node 504 and the YS inputted to the node 505 are VSS. At this time, a selection signal s1 of the selector 508 and the selection signal s2 of the selector 509 are VSS, the selector 508 selects a node 501 (VPP) side and the selector 509 selects an output in the selector 508 side.

By inputting of the RST, initial reset operation is performed and the output s3 of the DFF 514 is determined to be VSS. Next, the output s3 of the DFF 514 is inputted to the selector 510 and the selector 510 selects an output in the selector 509 side. Thus, a value of the output (SHR) of the node 507 is determined and the value is VPP. Since the output of the DFF 514 is inputted to one terminal of the inverter NOR 512 and the value is VSS, a value of the output n1 of the inverter NOR 512 is transited by an input of the other terminal. The output n2 of the NAND 513 is determined by the SAN and the output n1 of the inverter NOR 512 of a previous stage. When the SAN is VSS, the output n2 of the NAND 513 is VPP irrespective of a value of the output n1 of the inverter NOR 512 of the previous stage.

After the initial reset operation, if the SAN transits from VSS to VPP, the output of the selector 508 switches from the node 501 (VPP) input side to a node 502 (V1) input side. Thereby, the values of the output of the selectors 509, 510 also change and the value of the SHR transits from VPP to V1. And, the SAN is also inputted to the NAND 513, with transition from VSS to VPP, the value of the output n2 of the NAND 513 transits by the output n1 of the inverter NOR 512 in the previous stage which is an input to the other input of the NAND 513.

The selection signal s2 of the selector 509 is obtained by passing the SAN through the delay circuit 511, and inputted with delay of td. Here, td is delay time required for a signal to pass the delay circuit 511. If the s2 is inputted, the output of the selector 509 is switched from the output of the selector 508 side to the input of the node 503 (V2) side. Therefore, a value of the output of the selector 510 also changes and the value of the SHR transits from V1 to V2.

Since the value of the s3 inputted to the inverter NOR 512 is VSS, if the YS is inputted, the value of the output n1 transits with delay by certain time. Since the SAN inputted to one terminal of the NAND 513 in next stage is VPP, a signal having polarity reversed with respect to the input n1 is outputted (n2) with delay by certain time. Since the n1 is VSS until the YS is inputted, the value of n2 is VPP until the YS is inputted. The value of the n2 transits from VPP to VSS when the YS transits from VSS to VCL. On the contrary, when the YS transits from VCL to VSS, the value of the n2 transits from VSS to VPP. At this time, the output s3 of the DFF 514 transits from VSS to VPP, the output of the selector 510 switches from the output in the selector 509 side to VPP input side and the value of the SHR transits from V2 to VPP. The present proposed circuit system performing the series of operation enables the SHRMOS transistor gate voltage 4-value control.

In FIG. 5, the 4-stage selector configuration is adopted, however, the voltage can be dropped to the intermediate potential in n stages by increasing the number of selectors to n stages.

Figure 7:
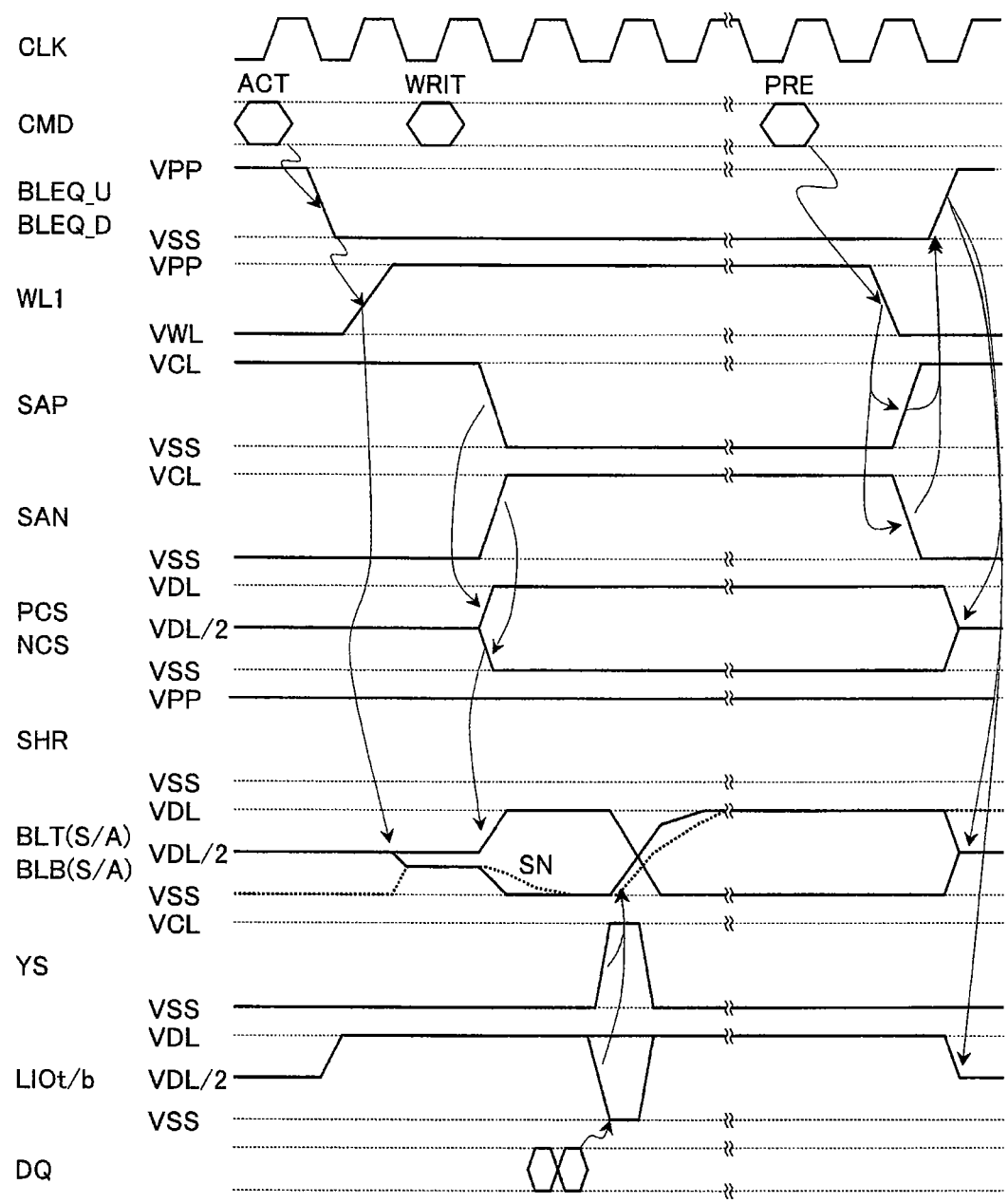
FIG. 7 is a diagram showing a write operation waveform example of a synchronous DRAM in the semiconductor memory device according to the first embodiment of the present invention.

Next, write operation is described using FIG. 7. The operation is similar to the above described read operation from a step at which the active command ACT is inputted to a step at which the sense amplifier is activated and the column command inputted, other than that the SHRMOS transistor gate voltage is VPP. When performing the write operation, it is performed by inputting a write command WRIT and a write address simultaneously in the column command input waiting state. That is, there are cases in which they are inputted immediately after the active command as shown in FIG. 7 or inputted after the read command READ. Write data is inputted at the same time as the command and the address or at a rising or falling edge of the clock after one clock cycle time. The write data is inputted from an input/output pin DQ and transferred to the local IO line LIOt/b. The transferred data is written to the sense amplifier circuit connected with the write cell by the column selection signal YS selected according to the write address inputted with the write command. In the sense amplifier, the bit line is driven and the data is written to a storage node of the memory cell according to the data written from the local IO line LIOt/b. In FIG. 7, a waveform diagram in which 'H' data is written with respect to a cell having read data of 'L' is shown. Internal operation after the pre-charge command is inputted is the same as that in the read operation described above. Although a part of operation of a DDRSDRAM is explained in this operation, the present invention can be applied to a general SDRAM or a DDR2-SDRAM.

Figure 23:
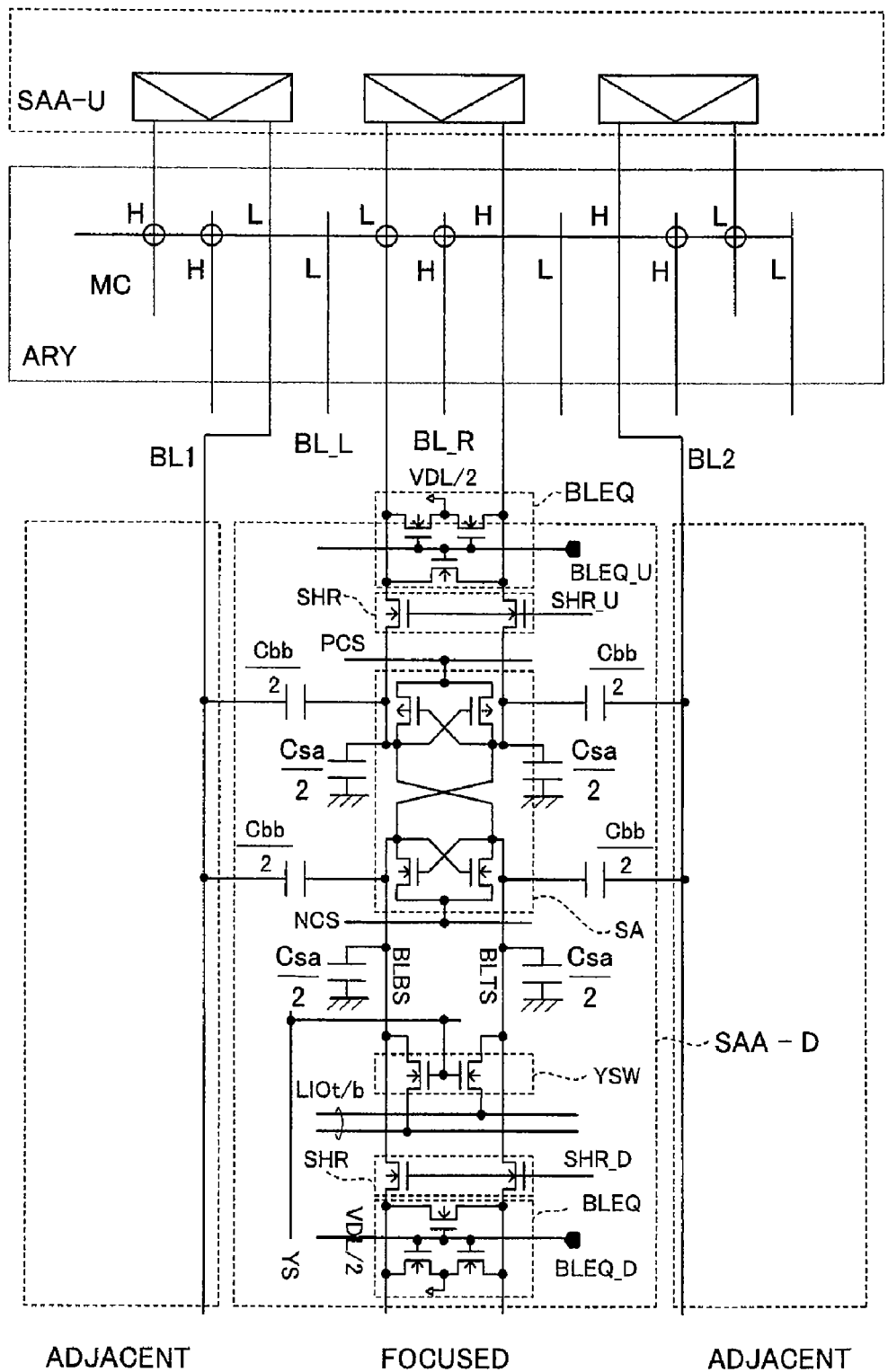
FIG. 23 is a diagram showing a configuration of a memory cell array and a sense amplifier array in a case where a bit line in the sense amplifier is twisted in the semiconductor memory device according to the first and the second embodiments of the present invention.

FIG. 23 shows a memory cell array ARY and a sense amplifier array SAA_D (SAA_U) in a case where the bit lines are twisted in the present invention. By twisting the bit lines, the noise received from the adjacent bit lines (BL1/BL2) which is a problem in lowering the SHRMOS transistor gate voltage and separating the sense amplifier and the memory cell array in the conventional system and the present invention as described above can be further reduced. In FIG. 23, it is assumed that a twist ratio of the bit lines in the sense amplifier is 1:1 which provides highest noise reducing effect, and that length of the bit lines in the sense amplifier is divided in half. In this case, the bit line capacitance in the sense amplifier and the capacitance between adjacent bit lines are divided in half. The noise received from the adjacent bit line BL1 (BL2) can be canceled. If the twist ratio is 1:1, noise received by the bit line BLBS (BLTS) in the sense amplifier from the adjacent bit line BL1 (BL2) becomes equal. Since the bit lines BLBS and BLTS in the sense amplifier have opposite polarities, the noise received from the adjacent bit line BL1 (BL2) is canceled and becomes "0". That is, by twisting the bit lines, the noise from the adjacent bit line received via the capacitance between the adjacent bit lines during amplification, which is a problem when the gate voltage of the SHRMOS transistor is lowered, becomes "0".

Figure 24:
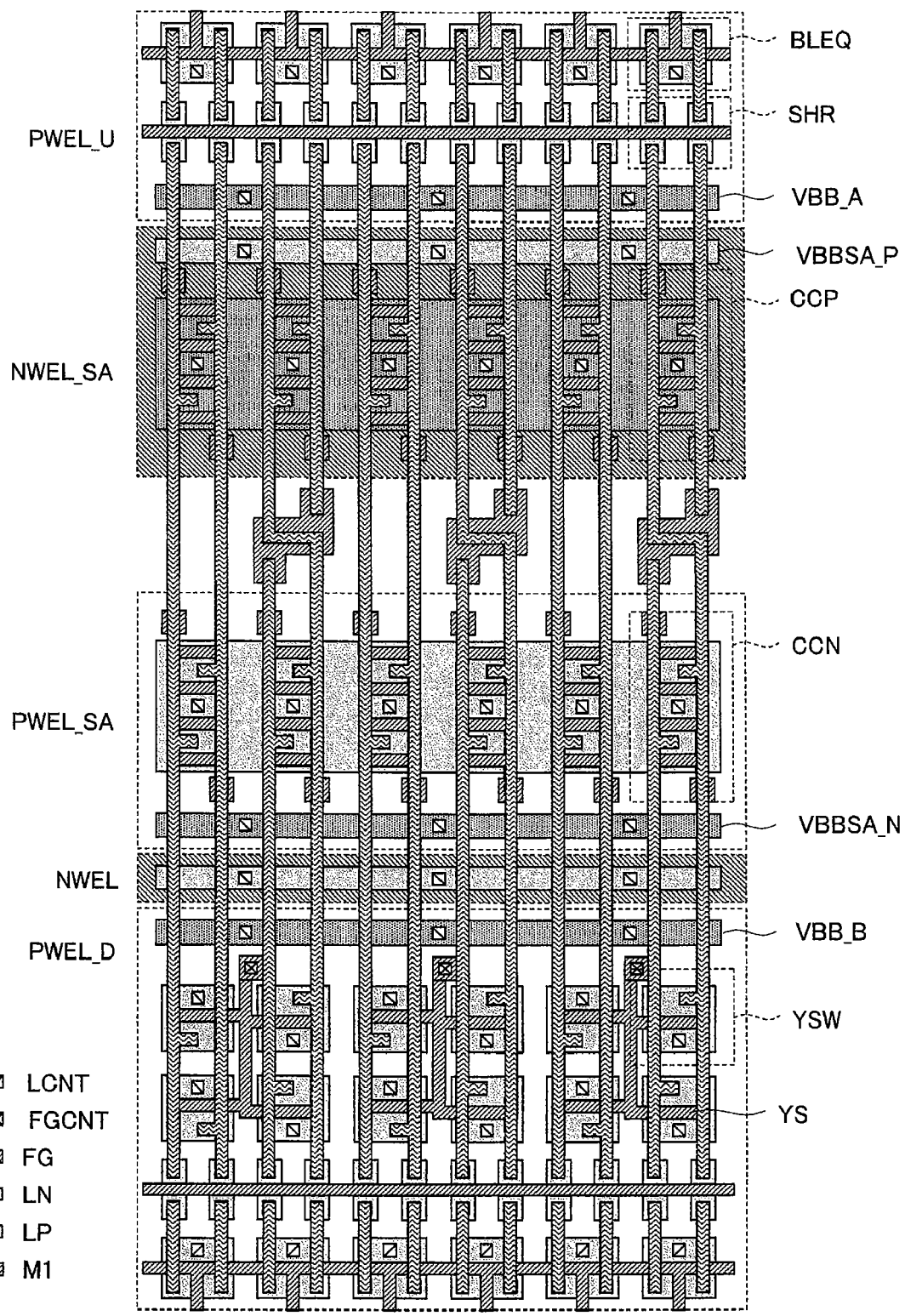
FIG. 24 is a diagram showing a layout of the sense amplifier shown in FIG. 23.

FIG. 24 is a plane layout diagram of the sense amplifier array in a case where the bit lines are twisted. A part of a symbol indicating a portion surrounded by a broken line corresponds to each circuit configuring the sense amplifier array SAA_D of FIG. 23. And, outer boxes of the broken line indicate PWEL and NWEL, respectively. A portion indicated only by the outer box of the broken line is PWEL, and a portion inside the outer box of the broken line painted with diagonal lines is NWEL. YS indicates the column selection signal. And, meaning of symbols in FIG. 24 are, a gate contact FGCNT connecting a gate electrode and a wiring layer M1 (bit line) of a first layer, diffusion layers LN, LP, a gate electrode FG and a diffusion layer contact LCNT connecting the diffusion layers LN, LP and a wiring layer M1. In the layout diagram example, although a NMOS cross couple CCN and an YSW are the same PWEL, by providing the NWEL therebetween and separating them, a configuration in which only substrate potential VBBSA_N of a NMOS cross couple CCN can be independently controlled is obtained. However, because of this WEL separation, layout area is increased. If there is no need to control independently only the substrate potential VBBSA_N of the NMOS cross couple CCN, the layout area can be reduced by eliminating the WEL separation. And, differently from other transistors, a PMOS cross couple (CCP) and a NMOS cross couple (CCN) configuring the sense amplifier are configured by a so-called ring gate in order to ensure driving force of a MOS transistor and to suppress variation of threshold values of MOS transistors which is a cause of noise that is challenge of the present invention.

Figure 8:
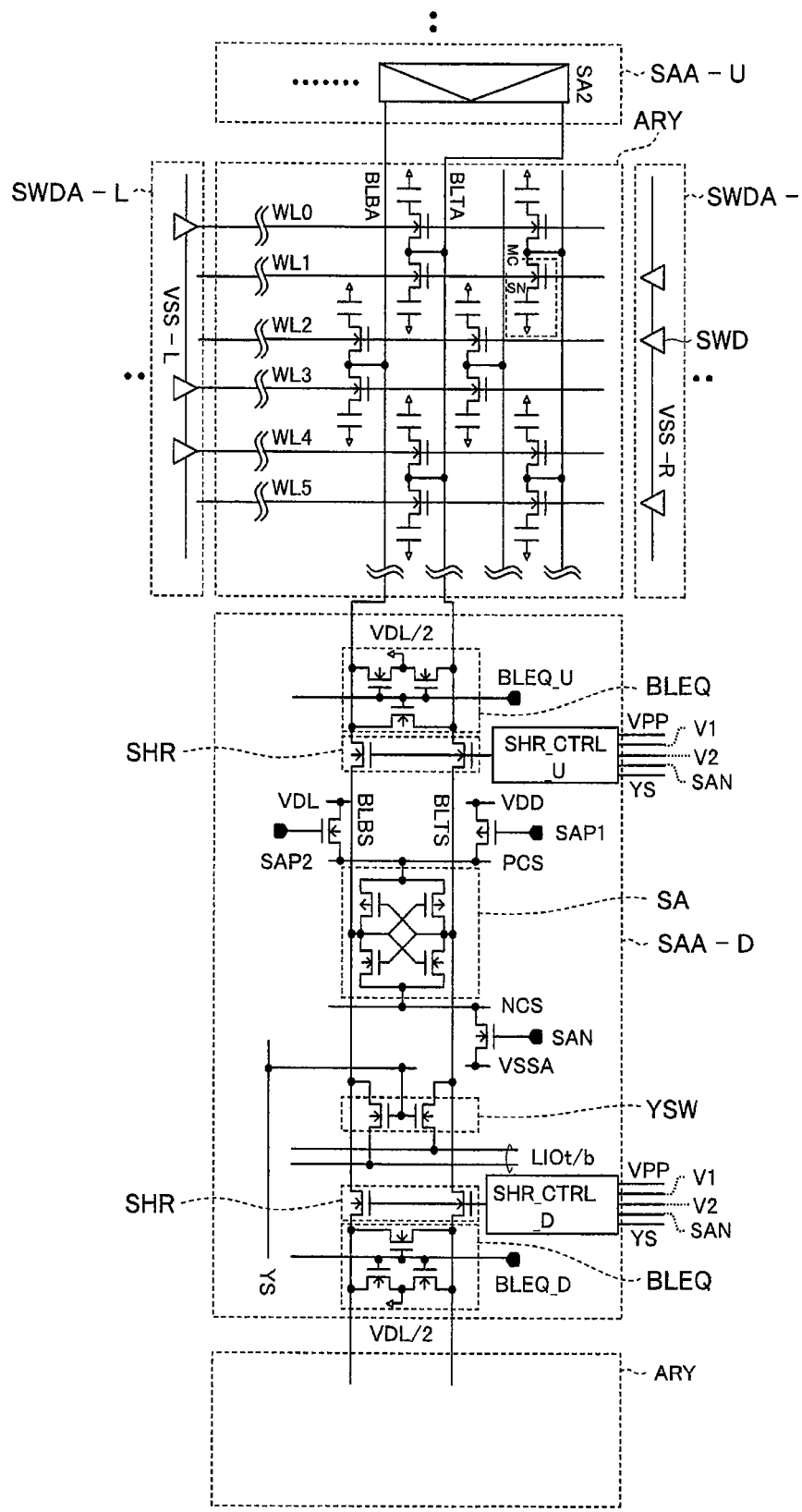
FIG. 8 is a diagram showing an arrangement example in a case where a bit line overdrive system is applied to the SHRMOS transistor gate voltage 4-value control circuit in the semiconductor memory device according to the first embodiment of the present invention.

FIG. 8 shows the memory cell array ARY and the sense amplifier array SAA in a modification example of the first embodiment adopting a bit line overdrive system. The memory cell array ARY is composed of a plurality of memory cells MCs. The DRAM cell is composed of one MOS transistor and one capacitor. In the DRAM cell, one of the source terminal and the drain terminal of the MOS transistor is connected to the bit line, the other of the source terminal and the drain terminal is connected to the storage node SN and the gate terminal is connected to the word line. One terminal of the capacitor is connected to the storage node SN and the other terminal of the capacitor is connected to the ground.

A plurality of sense amplifiers SAs is arranged in the sense amplifier array SAA, and connected to the bit lines of the memory cell arrays on both sides. The SHRMOS transistor SHR is a transistor controlling connection/non-connection of the sense amplifier array and the memory cell array ARY. Normally, only the connection/non-connection is controlled as described above, but in the present proposed system, the SHRMOS transistor gate voltage control circuits (SHR_CTRL_U/SHR_CTRL_D) are provided and fine control of the gate voltage of the SHRMOS transistor is performed.

The pre-charge circuit BLEQ equalizes between bit lines forming a pair when the pre-charge signal (BLEQ) is activated, and performs pre-charge to a bit line pre-charge level. The bit line pre-charge level is normally set to a middle point VDL/2 of the bit line amplitude voltage VDL (a same level as or a level dropped from the power source voltage VDD from outside of the chip).

The sense amplifier (cross couple amplifier) SA is a circuit driving the PMOS side common source PCS to VDD by a overdrive signal SAP1 after a microscopic read signal from the memory cell is generated on the bit line, then, driving to VDL by a restore signal SAP2, driving the NMOS side common source line NCS to VSS, amplifying one of the bit lines BLT and BLB having a higher voltage to VDL and amplifying the other one having a lower voltage to VSS.

When the column selection signal YS is activated, the local IO line LIOt/b and the bit line pair are connected. The LIO is pre-charged to VBLR during standby to prevent current consumption in the non-selected sense amplifier array.

Figure 9:
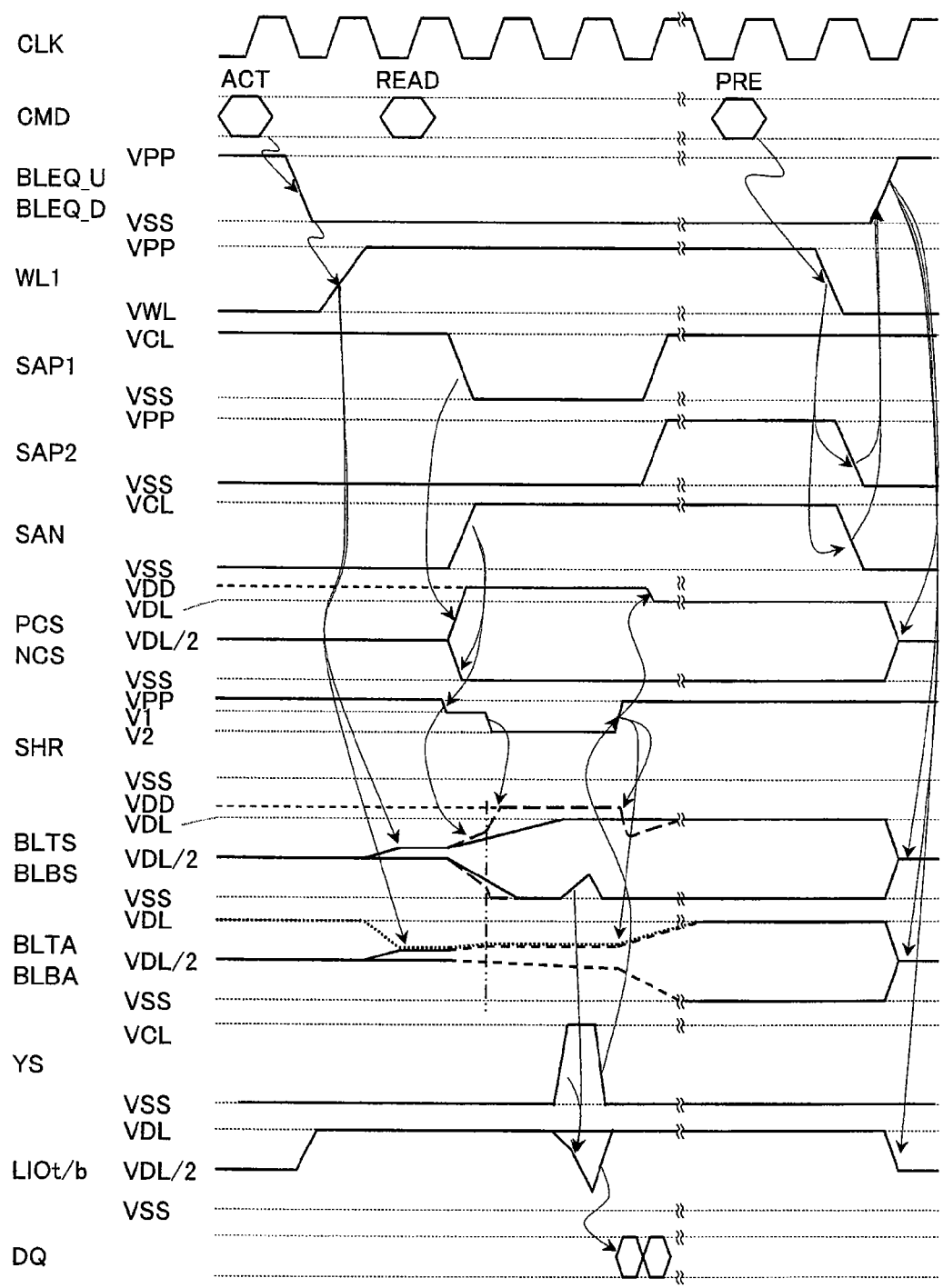
FIG. 9 is a waveform diagram showing a read operation example of the synchronous DRAM applied with the SHRMOS transistor gate voltage 4-value control circuit and the bit line overdrive system in the semiconductor memory device according to the first embodiment of the present invention.

Operation of the memory cell array is described using FIG. 9. FIG. 9 is an example of a read operation waveform diagram of the semiconductor memory device applied with the present invention. When the active command ACT is inputted together with the row address, the address is decoded inside. Thereby, the bit line pre-charge signals BLEQ_U, BLEQ_D transit to the inactivated state in a sense amplifier block of the corresponding address. Here, since the pre-charge circuit BLEQ is configured by NMOS, transition is performed from a high potential level of the activated state, for example, the word line boosting power source VPP or the bit line amplitude voltage VDL to the ground level VSS. Therefore, the pre-charge of the bit line of the corresponding memory cell array stops.

Next, the word line WL corresponding to the inputted address is selected. Here, the selected word line activates one word line connected to one memory cell, for example, WL1 in FIG. 8. The word line WL1 to be activated transits from the word line standby level VWL to the word line selection level (word line boosting power source VPP). Accordingly, in the memory cell MC, the gate of the transistor transits to a selected state, the storage node SN and the bit line are connected and data of the memory cell is read to the bit line. Here, a case in which data of 'H' is stored in the memory cell storage node SN is described. In this case, the bit line has a voltage higher than the pre-charge level as much as charges accumulated in the storage node SN.

After a predetermined period elapsed since the word line is activated, the NMOS sense amplifier activation signal SAN transits from the ground level VSS of the non-selected state to the high potential VCL of the activated state or the word line boosting power source VPP and the NMOS cross couple of the sense amplifier SA is activated. At this time, the SHRMOS transistor gate voltage control circuit operates and transits the SHR voltage from VPP to the intermediate potential V1 between VPP and VSS. And then, after certain time elapsed, the voltage is transited from V1 to V2. Thus, the sense speed is increased in two stages while securing noise tolerance, as described above.

At substantially the same time as or slightly delayed from the SAN, the PMOS sense amplifier activation overdrive signal SAP1 transits from the high potential state VCL of the non-selected state or the word line boosting power source VPP to the ground level VSS in the activated state and the PMOS cross couple of the sense amplifier SA is activated. After activation of the PMOS cross couple, the PMOS side common source line PCS is driven to VDD by the overdrive signal SAP1, and therefore, the gate voltage of the PMOS increases compared with a case in which the overdrive is not performed. Thus, a microscopic signal voltage generated in the bit line is amplified to the bit line amplitude voltage and the sense speed is increased. The column command input waiting state is then obtained in this state. The actual column command can be inputted at the same time as or before the bit line amplitude becomes sufficient amplitude.

Here, an example in which a read command READ is inputted from outside is described. A column address desired to be read is inputted at the same time as the read command READ. When the read command is inputted, the column selection signal YS from the column decoder transits from the ground level VSS of the standby state to the high potential VCL (the bit line amplitude voltage VDL or the like) of the selected state according to the address inputted simultaneously and the activated state is obtained. Thus, the data held in the sense amplifier SA is read to the local IO line LIOt/b.

And, when the column selection signal YS transits from the high potential VCL (the bit line amplitude voltage VDL or the like) of the selected state to the ground level VSS of the standby state, the SHRMOS transistor gate voltage control circuits (SHR_CTRL_U, SHR_CTRL_D) operate and transit the gate voltage of the SHRMOS transistors from the intermediate potential V2 to VPP. At this time, the memory cell array ARY and the sense amplifier array SAA are re-coupled, charges of the bit line in the sense amplifier in an H side move to a memory cell array ARY side, and therefore, potential in the H side of the bit line temporarily lowers. In a case where the potential in the H side of the bit line lowers greatly, there is a possibility that the data read is unsuccessful. So, the overdrive of the PCS is continued even after the SHRMOS transistor gate voltage is returned to VPP using the overdrive system, and after certain time elapsed, the overdrive is terminated and the PCS is returned from VDD to VDL. Thereby, the lowering of the potential in the H side of the bit line is suppressed as much as possible, and influence on the data read operation can be suppressed.

And then, although not shown in diagrams, the data is output to outside through the main amplifier and the input/output unit.

Next, operation in a case where the pre-charge command PRE is inputted is described. If the pre-charge command is inputted in the command input waiting state, a selected word line WL1 transits to the word line standby level VWL of the non-selected state. Accordingly, the sense amplifier activation signals SAN, SAP2 transit to the non-selected state. After the sense amplifier transits to the inactivated state, the bit line pre-charge signals BLEQ_U, BLEQ_D transit to the activated state and all of bit lines and reference bit lines of the activated memory cell array ARY are set to the bit line pre-charge level. In FIG. 9, the bit line pre-charge level is set to VDL/2 which is ½ of the bit line amplitude voltage. Then, the pre-charge operation is completed.

Second Embodiment

The present proposed system performs operation of setting the gate voltage of the SHRMOS transistor to the intermediate potential VC during standby, and after input of the ACT command, setting the gate voltage of the SHRMOS transistor in a non-selected memory cell array side to VSS and returning the gate voltage of the SHRMOS transistor in a selected memory cell array side to VPP at a falling edge of the column selection signal. Thereby, the sense speed is increased and read of data is speed-up while reducing noise. And, since the gate voltage of the SHRMOS transistor is set at the intermediate potential VC during standby, current consumption while setting the gate voltage of the SHRMOS transistor in the non-selected side to a standby level can be reduced.

Figure 10:
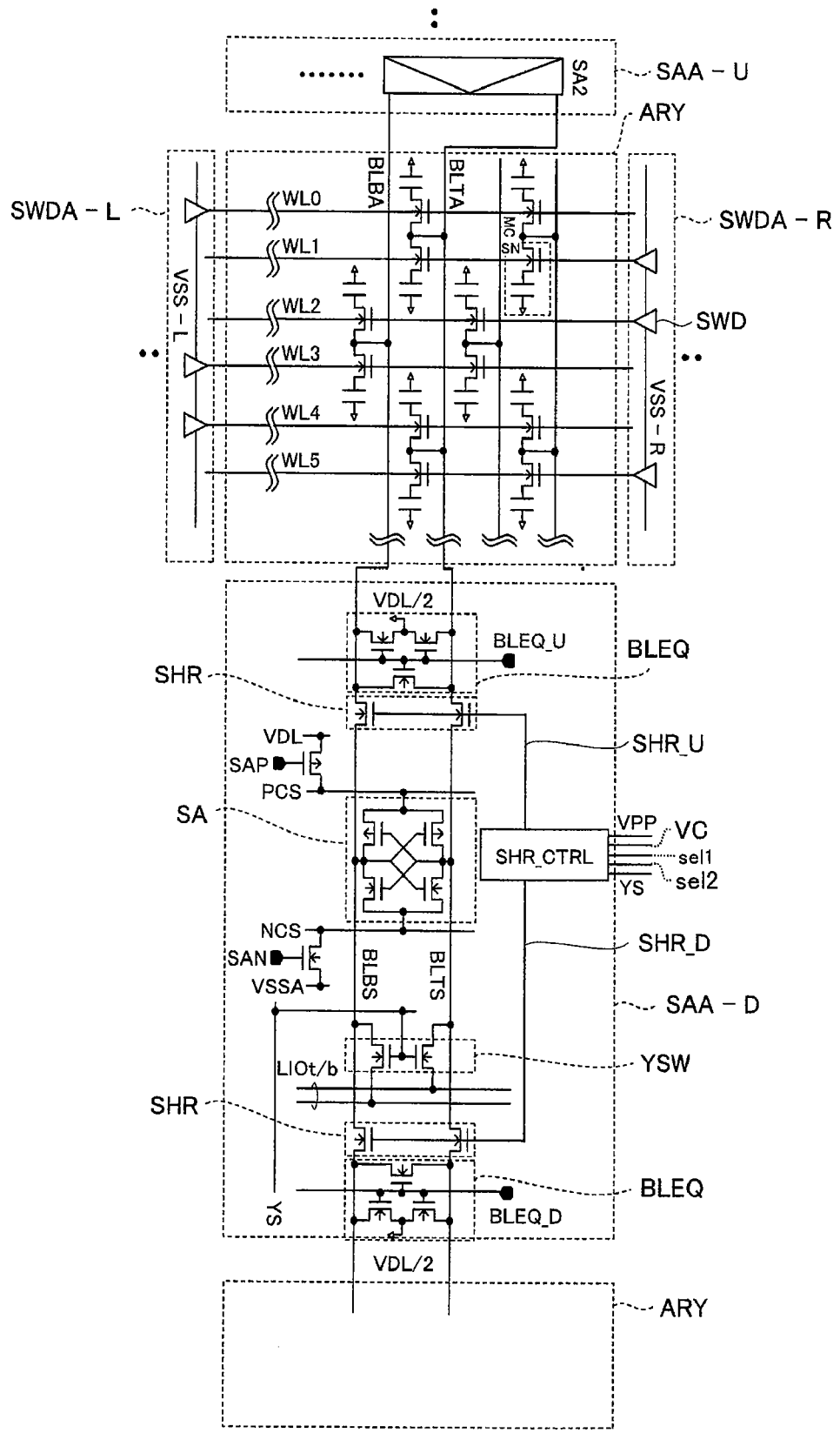
FIG. 10 is a diagram showing an arrangement example of a SHRMOS transistor gate voltage 3-value control circuit in a semiconductor memory device according to a second embodiment of the present invention.
Figure 11:
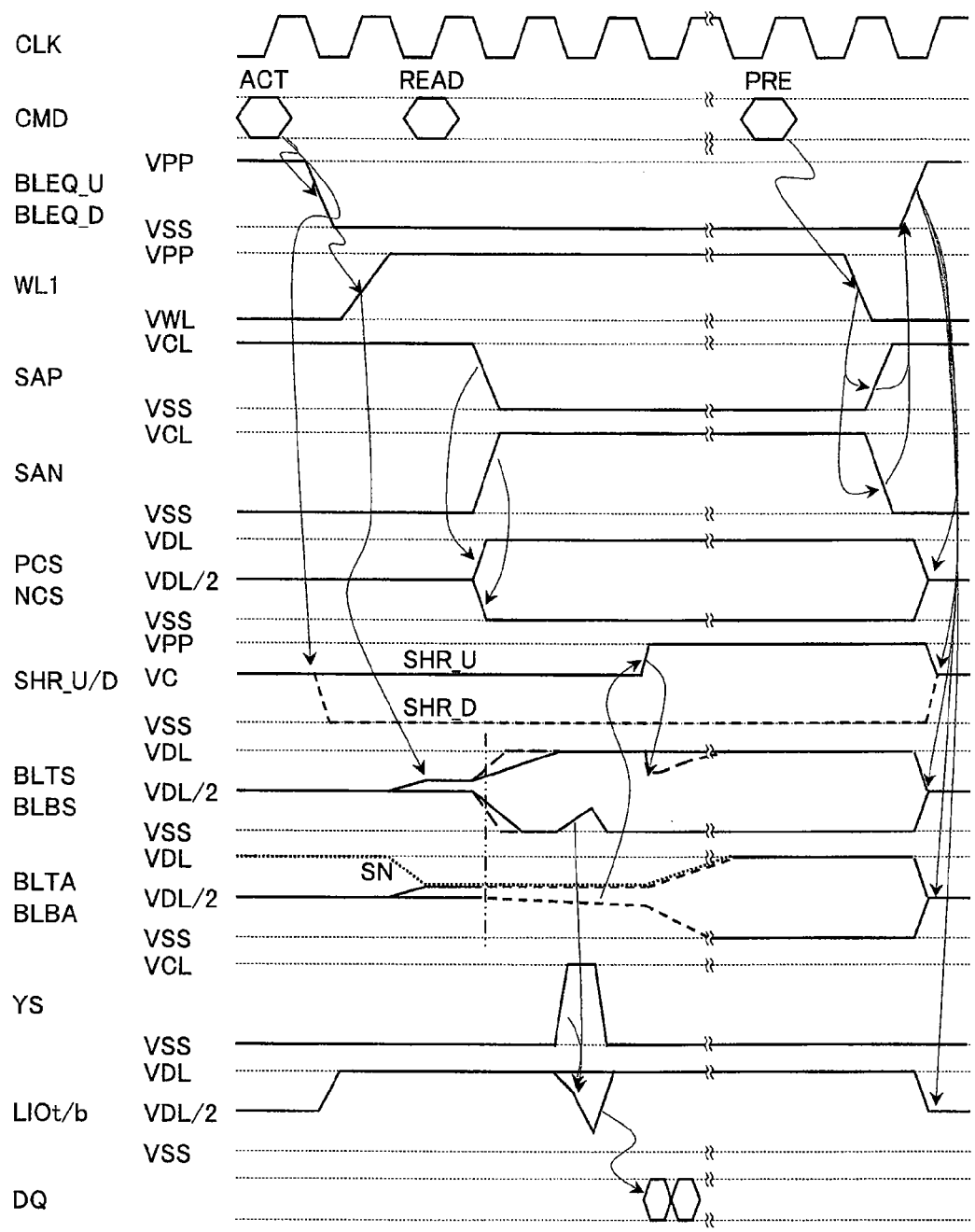
FIG. 11 is a waveform diagram showing a read operation example of a synchronous DRAM applied with the SHRMOS transistor gate voltage 3-value control circuit in the semiconductor memory device according to the second embodiment of the present invention.
Figure 12:
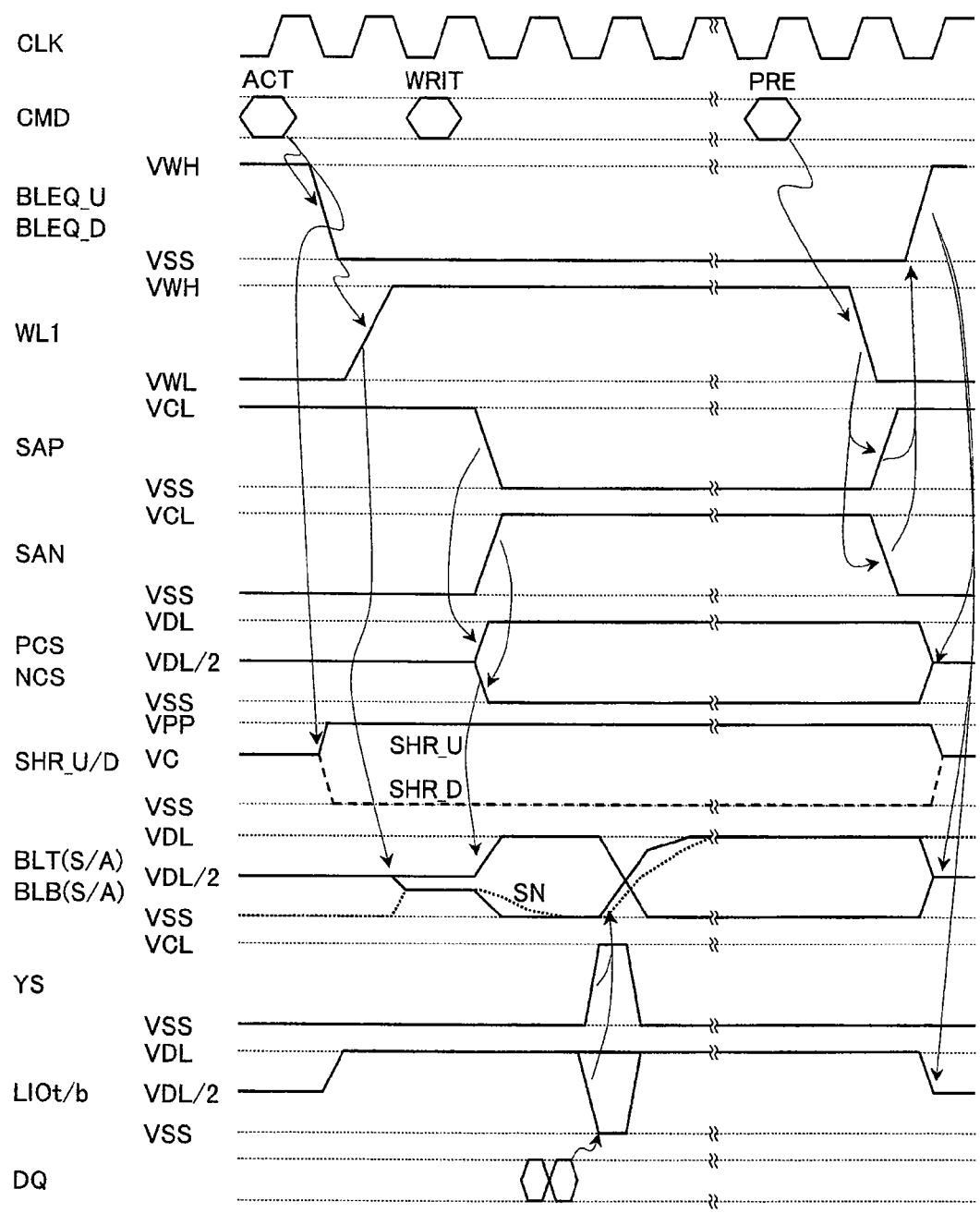
FIG. 12 is a waveform diagram showing a write operation example of a synchronous DRAM applied with the SHRMOS transistor gate voltage 3-value control circuit in the semiconductor memory device according to the second embodiment of the present invention.

The semiconductor memory device according to one embodiment of the present invention is described using FIGS. 10 to 12.

FIG. 10 shows a memory cell array ARY and a sense amplifier array SAA. The memory cell array ARY is composed of a plurality of memory cells MCs. A DRAM cell is composed of one MOS transistor and one capacitor. One of a source terminal and a drain terminal of the MOS transistor is connected to a bit line, the other of the source terminal and the drain terminal is connected to a storage node SN and the gate terminal is connected to a word line. One terminal of the capacitor is connected to the storage node SN, and the other terminal of the capacitor is connected to ground.

A plurality of sense amplifiers SAs is arranged in the sense amplifier array, and connected to the bit lines of the memory cell arrays on both sides. The SHRMOS transistor SHR is a transistor controlling connection/non-connection of the sense amplifier array SAA and the memory cell array ARY. Normally, only the connection/non-connection is controlled, as described above, but in the present proposed system, the SHRMOS transistor gate voltage control circuit (SHR_CTRL) is provided and fine control of the gate voltage of the SHRMOS transistor is performed.

In the present invention, the gate voltage of the SHRMOS transistor is set to the intermediate potential VC at which data is not inverted by noise during standby so that a signal of the memory cell array is transmitted in the sense amplifier and the memory cell array capacitance is connected via a resistor, and therefore, the sense speed can be increased. Furthermore, by setting the level during standby to the intermediate potential VC, not to the word line boosting power source VPP, the consumption current can be reduced.

Here, a brief explanation of the consumption current in transiting the gate voltage of the SHRMOS transistor in the non-selected memory cell array side to the standby state is provided. For example, it is assumed that, the number of the MAT selected per one BANK is A, the number of SHRMOS transistors controlled in the MAT is B, wiring load capacitance of a gate voltage control line of the SHRMOS transistor is C, a gate voltage of the SHRMOS transistor during standby is VX and a read cycle is tRC, the current consumption can be expressed by the following equation.

$$A \cdot B \cdot C \cdot (VX - VSS)/tRC \tag{3}$$

It is recognized from the equation that the higher the gate voltage of the SHRMOS transistor during standby becomes, the more the current consumption increases. In the present invention, since VC-standby is adopted instead of conventional VPP-standby, the current consumption can be reduced. Furthermore, since the gate voltage of SHRMOS transistor in the selected memory cell array side is set to the intermediate potential VC instead of the conventional VSS, the current consumption can be reduced.

The pre-charge circuit BLEQ equalizes between bit lines forming a pair when the pre-charge signals BLEQ_U, BLEQ_D are activated, and performs pre-charge to the bit line pre-charge level. The bit line pre-charge level is normally set to a middle point VDL/2 of the bit line amplitude voltage VDL (same level as or level dropped from the power source voltage VDD from outside of a chip).

The sense amplifier (cross couple amplifier) SA is a circuit driving the PMOS side common source line PCS to VDL after a microscopic read signal from the memory cell is generated on the bit line, driving the NMOS side common source line NCS to VSS, amplifying one of bit lines BLT and the BLB having a higher voltage to VDL and amplifying the other one having a lower voltage to VSS. When the column selection signal YS is activated, the local IO line LIOt/b and the bit line pair are connected. The LIOt/b is pre-charged to VBLR during standby to prevent current consumption in the non-selected sense amplifier array.

Operation of the memory cell array is described using FIG. 11. FIG. 11 is an example of a read operation waveform diagram of the semiconductor memory device applied with the present invention. When the active command ACT is inputted together with the row address, the address is decoded inside. Thereby, the bit line pre-charge signals BLEQ_U, BLEQ_D transits to the inactivated state in a sense amplifier block of the corresponding address. Here, since the pre-charge circuit BLEQ is configured by NMOS, transition is performed from a high potential level of the activated state, for example, the word line boosting power source VPP or the bit line amplitude voltage VDL to the ground level VSS. Therefore, the pre-charge of the bit line of the corresponding memory cell array stops. And, the gate voltage (SHR_D) of the SHRMOS transistor SHR (in this case, a SHRMOS transistor in a lower portion) of a connection part between the non-selected memory cell array ARY and the sense amplifier SA transits from the intermediate potential VS of standby to VSS after inputting of the ACT.

Next, a word line WL corresponding to the inputted address is selected. Here, the selected word line activates one word line connected to one memory cell, for example, WL1 in FIG. 10. The word line WL1 to be activated transits from the word line standby level VWL to the word line selection level (word line boosting power source VPP). Accordingly, in the memory cell MC, the gate of the transistor transits to a selected state, the storage node SN and the bit line are connected and data of the memory cell is read to the bit line. Here, a case in which data of 'H' is stored in the memory cell storage node SN is described. In this case, the bit line has a voltage higher than the pre-charge level as much as charges accumulated in the storage node SN. The intermediate potential VC is set so that a signal is transmitted into the sense amplifier.

After a predetermined period elapsed since the word line (WL1) is activated, the NMOS sense amplifier activation signal SAN transits from the ground level VSS of the non-selected state to the high potential VCL of the activated state or the word line boosting power source VPP and the NMOS cross couple is activated.

At substantially the same time as or delayed from the SAN, the PMOS sense amplifier activation signal SAP transits from the high potential state VCL of the non-selected state or the word line boosting power source VPP to the ground level VSS of the activated state and the PMOS cross couple is activated. Thus, a microscopic signal voltage generated in the bit line is amplified to the bit line amplitude voltage. The column command input waiting state is then obtained in this state. The actual column command can be inputted at the same time as or before the bit line amplitude becomes sufficient amplitude.

Here, an example in which the read command READ is inputted from outside is described. The column address desired to be read is inputted at the same time as the read command READ. When the read command is inputted, the column selection signal YS from the column decoder transits from the ground level VSS of the standby state to the high potential VCL (the bit line amplitude voltage VDL or the like) of the selected state according to the address inputted simultaneously and the activated state is obtained. Thus, the data held in the sense amplifier is read to the local IO line LIOt/b. And, when the column selection signal YS transits from the high potential VCL (the bit line amplitude voltage VDL or the like) of the selected state to the ground level VSS of the standby state, the SHRMOS transistor gate voltage control circuit SHR_CTRL operates and transits the gate voltage (SHR_U/D) of the SHRMOS transistor from the intermediate potential VC to VPP.

And then, although not shown in diagrams, the data is outputted to outside through the main amplifier and the input/output unit.

Next, operation in a case where the pre-charge command PRE is inputted is described. If the pre-charge command PRE is inputted in the command input waiting state, a selected word line transits to the word line standby level VWL of the non-selected state. Accordingly, the sense amplifier activation signals SAN, SAP transit to the non-selected state. After the sense amplifier transits to the inactivated state, the bit line pre-charge signals BLEQ_U, BLEQ_D transit to the activated state and all of bit lines and reference bit lines of the activated memory cell array ARY are set to the bit line pre-charge level. In FIG. 11, the bit line pre-charge level is set to VDL/2 which is ½ of the bit line amplitude voltage. And, the SHRMOS transistors gate voltage (SHR_U/D) is set to the intermediate potential VC of the standby level. Then, the pre-charge operation is completed.

Next, write operation is described using FIG. 12. If the active command ACT is inputted, the SHRMOS transistor gate voltage (SHR_U) in the selected memory cell array side transits from the intermediate potential VC of the standby level to the word lines boosting power source VPP and the SHRMOS transistor gate voltage (SHR_D) in the non-selected memory cell array side transits from the intermediate potential VC of the standby level to the ground level VSS. From here, operation is similar to the above described read operation until the sense amplifier SA is activated and the column command is inputted. When performing the write operation, it is performed by inputting a write command WRIT and a write address simultaneously in the column command input waiting state. That is, there are cases in which they are inputted immediately after the active command as shown in FIG. 12 or inputted after the above-described read command READ. Write data is inputted at the same time as the command and the address or at a rising or falling edge of a clock after one clock cycle time. The write data is inputted from an input/output pin DQ and transferred to the local IO line LIOt/b. The transferred data is written to the sense amplifier circuit connected with the write cell by the column selection signal YS selected according to the write address inputted with the write command. In the sense amplifier SA, the bit line is driven and the data is written to a storage node of the memory cell according to the data written from the local IO line LIOt/b. In FIG. 12, a waveform diagram in which 'H' data is written with respect to a cell having read data of 'L' is shown. Internal operation after the pre-charge command is inputted is the same as that in the read operation described above. Although a part of operation of a DDRSDRAM is explained in this operation, the SHRMOS transistor gate voltage control method of the present invention can be applied to a general SDRAM or a DDR2-SDRAM.

Figure 13:
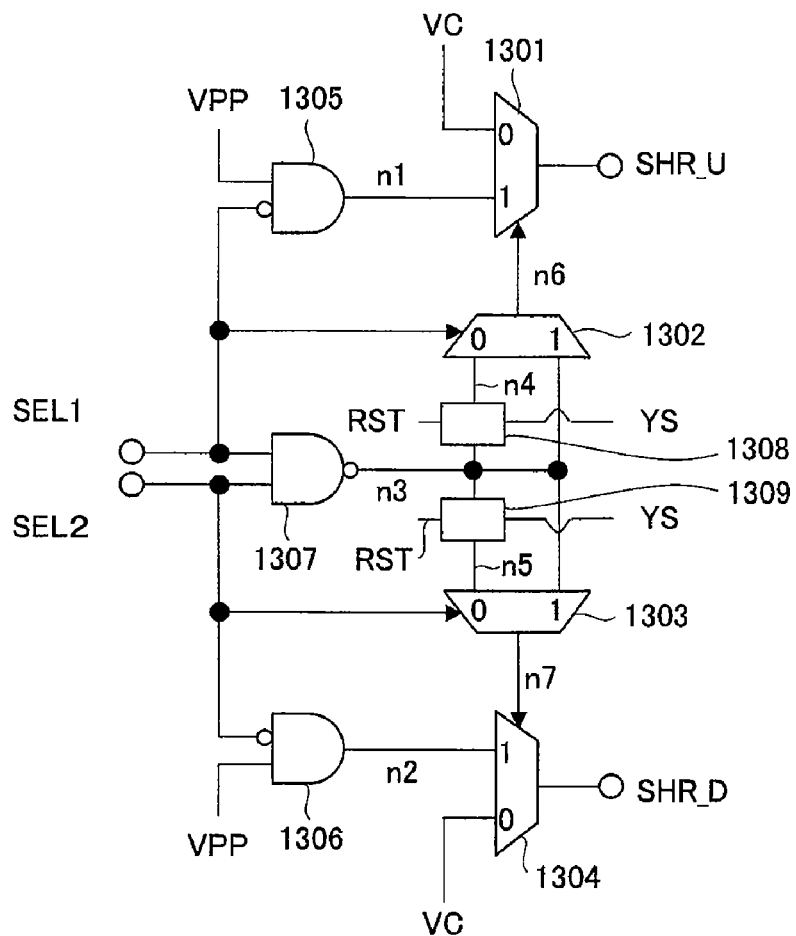
FIG. 13 is a block diagram showing the SHRMOS transistor gate voltage 3-value control circuit in the semiconductor memory device according to the second embodiment of the present invention.

FIG. 13 is an entire block diagram of the SHRMOS transistor gate voltage control circuit SHR_CTRL for realizing the semiconductor memory device of the second embodiment. The present proposed system is composed of a 4-stage selector (1301, 1302, 1303, 1304), a 2-stage inverter AND (1305, 1306), a 1-stage NAND (1307), and a 2-stage re-coupling control circuit (1308, 1309).

To the NAND 1307, two SHRMOS transistor selection signals (SEL1/SEL2) are inputted. The SHRMOS transistor selection signal SEL1 is inputted also as a selection signal of the selector 1302, and is also inputted to the inverter AND 1305. Similarly, the SHRMOS transistor selection signal SEL2 is inputted also as a selection signal of the selector 1303, and is also inputted to the inverter AND 1306. To one terminal of the inverter AND 1305, the VPP is inputted and an output of the inverter AND 1305 is connected to the selector 1301. Similarly, to one terminal of the inverter AND 1306, the VPP is inputted and an output of the inverter AND 1306 is connected to the selector 1304. An output of the NAND 1307 is connected to the selectors 1302, 1303 and the re-coupling control circuits 1308, 1309. An output of the re-coupling control circuit 1308 is connected to the selector 1302 and an output of the re-coupling control circuit 1309 is connected to the selector 1303. An output of the selector 1302 is connected to the selector 1301 and switches two inputs (VC/output of inverter AND 1305) of the selector 1301. Similarly, an output of the selector 1303 is connected to the selector 1304, and switches two inputs (VC/output from inverter AND 1306) of the selector 1304. An output of the selector 1301 is the gate voltage control voltage of the SHRMOS transistor of an upper portion of the sense amplifier array SAA. Similarly, an output of the selector 1304 is the gate voltage control voltage of the SHRMOS transistor of a lower portion of the sense amplifier array SAA.

Figure 14:
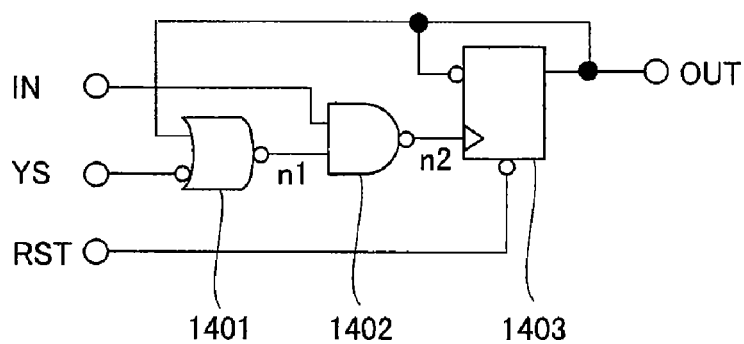
FIG. 14 is a block diagram showing a re-coupling control circuit in the semiconductor memory device according to the second embodiment of the present invention.

FIG. 14 is a detailed circuit block diagram of the re-coupling control circuits 1308, 1309 of FIG. 13. The circuit is composed of an inverter NOR 1401, a NAND 1402 and an inverter DFF 1403.

To one input of the inverter NOR 1401, the column selection signal YS is connected, and to other input, an output of the inverter DFF 1403 is connected. To one terminal of the NAND 1402, a signal IN is inputted, and to the other terminal, an output of the inverter NOR 1401 is connected. To a clock terminal of the inverter DFF 1403, an output of the NAND 1402 is connected, and to a data terminal, an output OUT is connected. The output OUT of the inverter DFF 1403 is an output of the re-coupling control circuit.

Figure 15:
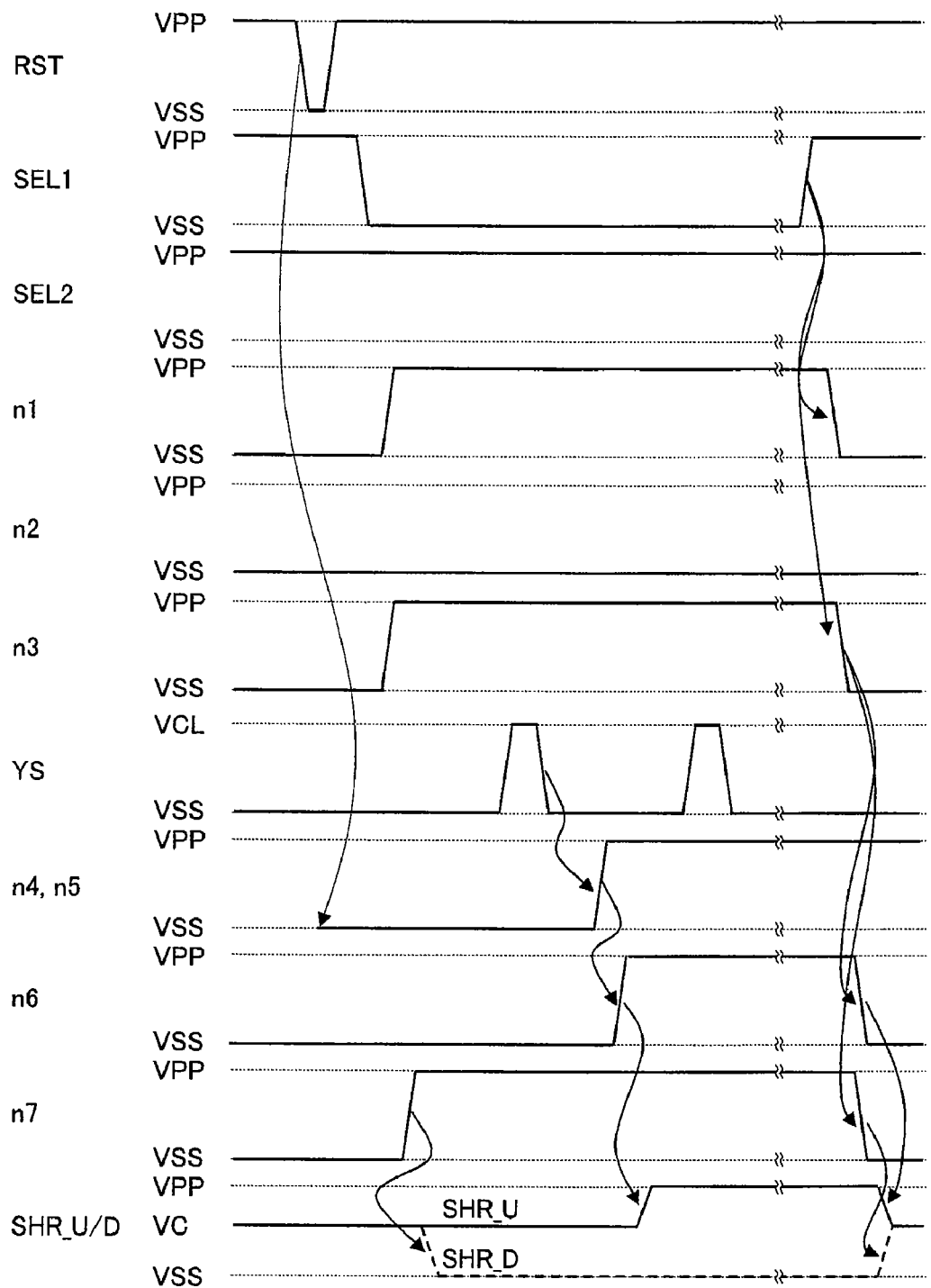
FIG. 15 is a waveform diagram showing an operation example of the SHRMOS transistor gate voltage 3-value control circuit in the semiconductor memory device according to the second embodiment of the present invention.

Circuit operation of FIG. 13 is described using a timing chart of FIG. 15. At first, the SHRMOS transistor selection signals SEL1, SEL2 are both VPP. An output n3 of the NAND 1307 becomes VSS. In the selector 1302, '1' side is selected, and in the selector 1304, '1' side is selected. Outputs n6, n7 of the selectors 1302 and 1303 are, since the n3 is outputted, both VSS. The selector 1301 is controlled by the n6 and the selector 1304 is controlled by the n7. Now, since the n6 and the n7 are both VSS, in the selectors 1301, 1304, '0' side is selected. Accordingly, the outputs of the selectors 1301, 1304 become the intermediate potential VC.

By inputting the RST, initial reset operation is performed and outputs n4, n5 of the re-coupling control circuits 1308, 1309 are determined as VSS.

After the initial reset operation, if the SEL1 transits from VPP to VSS, the output of the selector 1302 switches from '1' side (NAND output side) to '0' side (re-coupling control circuit side), but a value of the output of the selector 1302 does not change. On the other hand, since the SEL2 does not transit and remains at VPP, the output of the selector 1303 remains unchanged at '1' side (NAND output side). An output n3 of the NAND 1307 transits from VSS to VPP with transition of the SEL1 from VPP to VSS. Therefore, the output n7 of the selector 1303 also transits from VSS to VPP. Thereby, the output of the selector 1304 switches from '0' side (VC side) to '1' side (inverter AND 1306 output side). An output n2 of the inverter AND 1306 is VSS since the SEL2 is VPP. Accordingly, a value of the output SHR_D of the selector 1304 transits from VC to VSS.

After the value of SEL1 (or SEL2) transits from VPP to VSS, when a first falling edge of the YS is inputted to the re-coupling control circuits 1308, 1309 (when transiting from VCL to VSS), values of the outputs n4, n5 transit from VSS to VPP. At this time, since '0' side (output of re-coupling control circuit 1308 side) is selected in the selector 1302, and a value of the output n6 of the selector 1302 also transits from VSS to VPP. On the other hand, since '1' side (output n3 of the NAND 1307 side) is selected in the selector 1303, a value of output n7 does not change.

The output SHR_U of the selector 1301 switches the output from '0' side (VC side) to '1' side (output n1 of inverter AND 1305 side) with transition of the output n6 of the selector 1302 from VSS to VPP. Accordingly, a value of the output SHR_U of the selector 1301 transits from VC to VPP. The SHRMOS transistor gate voltage 3-value control can be achieved by the present proposed circuit system performing the series of the operation described above.

Figure 16:
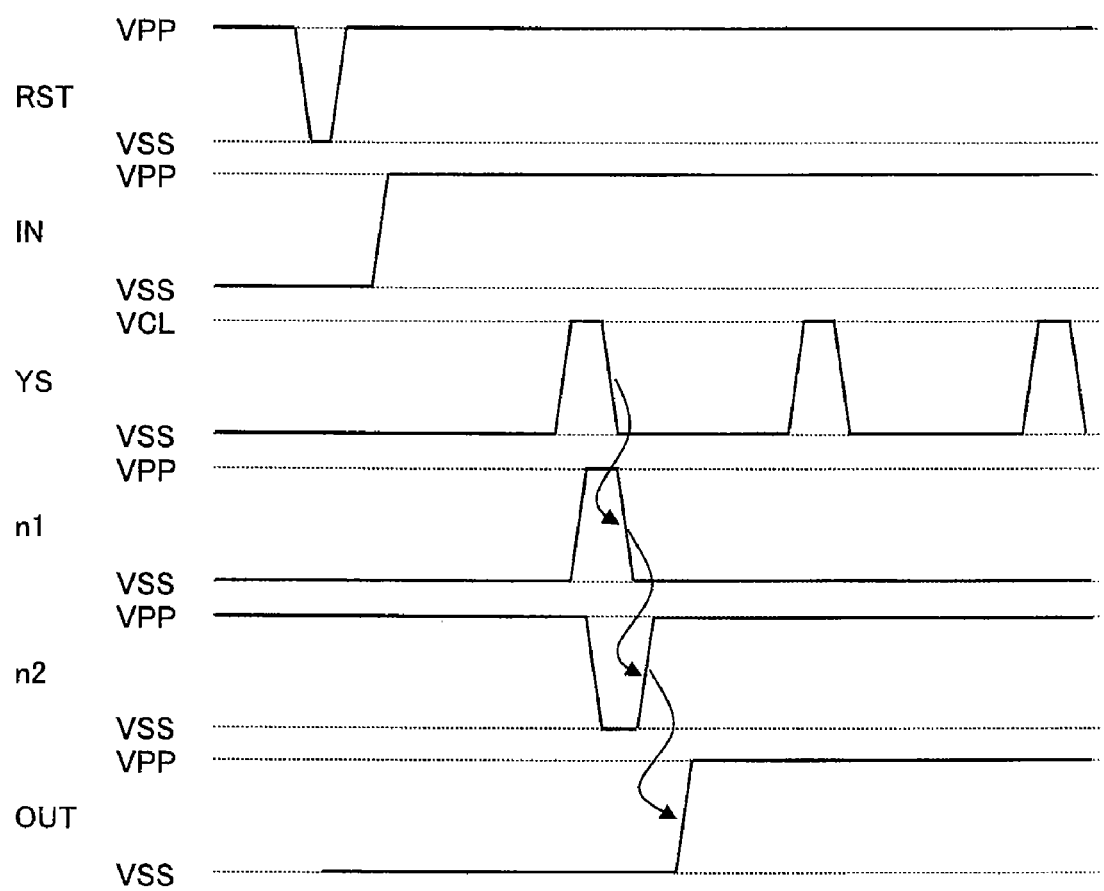
FIG. 16 is an example of an operation waveform diagram of the re-coupling control circuit.

Operation of the re-coupling control circuit of FIG. 14 is described using a timing chart of FIG. 16. At first, the inputs IN and YS are both VSS. An output n1 of the inverter NOR 1401 becomes VSS and an output n2 of the NAND 1402 becomes VPP.

By inputting the RST, initial reset operation is performed and an output OUT of the re-coupling control circuit is determined as VSS. The output OUT is connected to one input terminal of the inverter NOR 1401 and connected to the data terminal of the inverter DFF 1403. Now, since the output OUT is VSS, a value of the output n1 of the inverter NOR 1401 is changed by the YS.

After the initial reset operation, if the IN transits from VSS to VPP, a value of the output n2 of the NANM 1402 is changed by the output n1 of the inverter NOR 1401 of a previous stage. Since the value of n1 is VSS, the value of the output n2 of the NAND 1402 does not change.

The output n1 of the inverter NOR 1401 transits from VPP to VSS for the first time by the first falling edge of the YS. Accordingly, the output n2 of the NAND 1402 transits from VSS to VPP. Since the output n2 is inputted to the inverter DFF 1403 as a clock, an output of the inverter DFF 1403 transits from VSS to VPP. The present proposed circuit system performing the series of the operation described above enables control of a re-coupling timing.

Similar to the first embodiment, in the second embodiment, the noise received from the adjacent bit lines during amplification can be made to 0 by twisting the bit lines.

Figure 17:
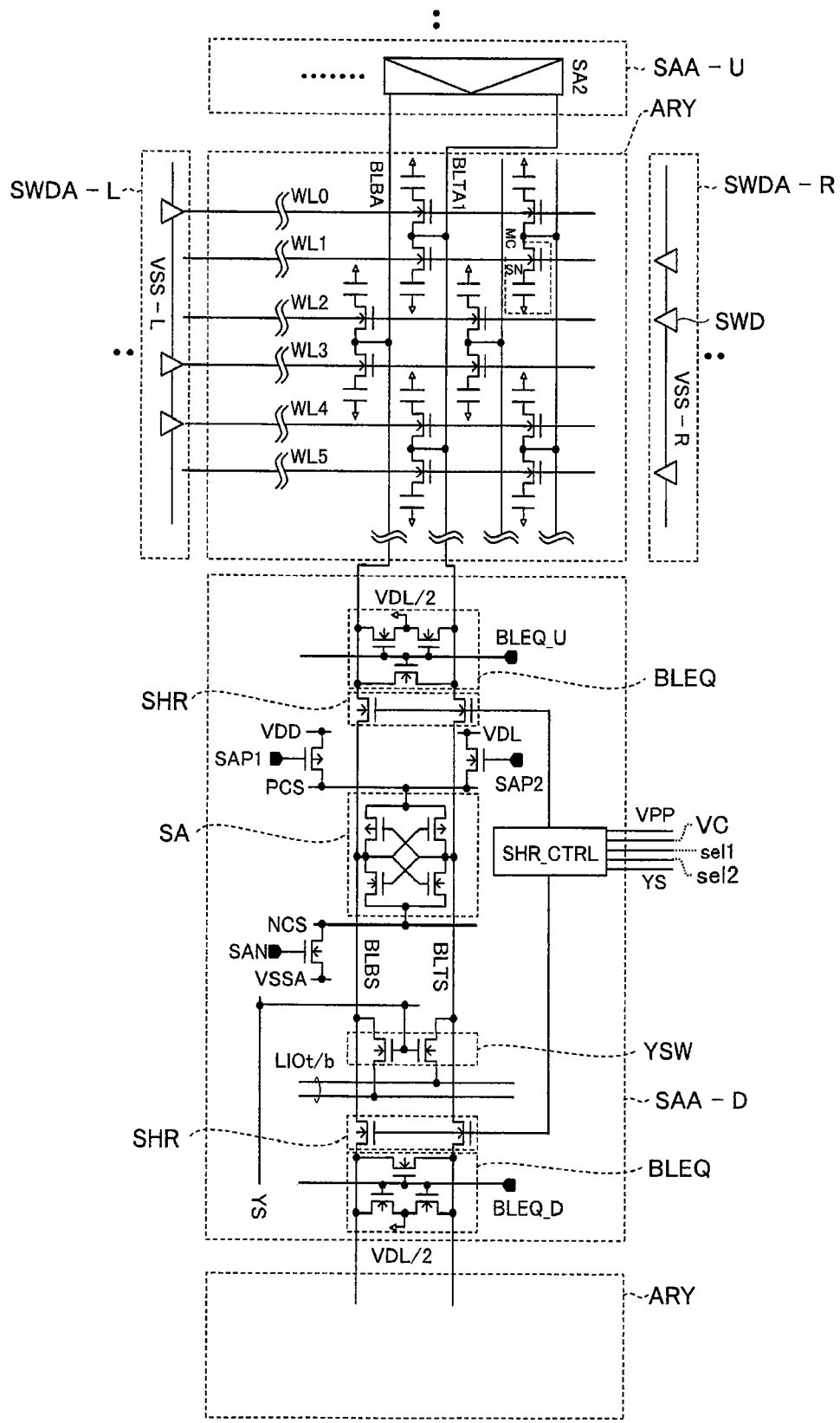
FIG. 17 is a diagram showing an arrangement example in a case where the bit line overdrive system is applied to the SHRMOS transistor gate voltage 3-value control circuit in the semiconductor memory device according to the second embodiment of the present invention.

FIG. 17 shows the memory cell array ARY and the sense amplifier array SAA in a modification example of the second embodiment adopting the bit line overdrive system. The memory cell array ARY is composed of a plurality of memory cells MC. The DRAM cell is composed of one MOS transistor and one capacitor. In the DRAM cell, one of the source terminal and the drain terminal of the MOS transistor is connected to the bit line, the other of the source terminal and the drain terminal is connected to the storage node SN and the gate terminal is connected to the word line. One terminal of the capacitor is connected to the storage node SN and the other terminal of the capacitor is connected to the ground.

A plurality of sense amplifiers SA is arranged in the sense amplifier array SAA and connected to the bit lines of the memory cell arrays on both sides. The SHRMOS transistor is a transistor controlling connection/non-connection of the sense amplifier array and the memory cell array ARY. Normally, only the connection/non-connection is controlled as described above, but in the present proposed system, the SHRMOS transistor gate voltage control circuit (SHR_CTRL) is provided and fine control of the SHRMOS transistor gate voltage is performed.

In the present invention, the gate voltage of the SHRMOS transistor is set to the intermediate potential VC at which data is not inverted by noise during standby so that a signal of the memory cell array is transmitted in the sense amplifier and the memory cell array capacitance is connected via a resistor, and therefore, the sense speed can be increased. Furthermore, by setting the level during standby to the intermediate potential VC, not to the word line boosting power source VPP, the consumption current can be reduced.

The pre-charge circuit BLEQ equalizes between bit lines forming a pair when the pre-charge signal BLEQ is activated, and performs pre-charge to the bit line pre-charge level. The bit line pre-charge level is normally set to a middle point VDL/2 of the bit line amplitude voltage VDL (same level as or level dropped from the power source voltage VDD from outside of a chip).

The sense amplifier (cross couple amplifier) SA is a circuit driving the PMOS side common source line PCS to VDD by a overdrive signal SAP1 after a microscopic read signal from the memory cell is generated on the bit line, then, driving to VDL by a restore signal SAP2, driving the NMOS side common source line NCS to VSS, amplifying one of the bit lines BLT and the BLB having a higher voltage to VDL and amplifying the other one having a lower voltage to VSS. When the column selection signal YS is activated, the local IO line LIOt/b and the bit line pair are connected. The LIO is pre-charged to VBLR during standby to prevent current consumption in the non-selected sense amplifier array.

Figure 18:
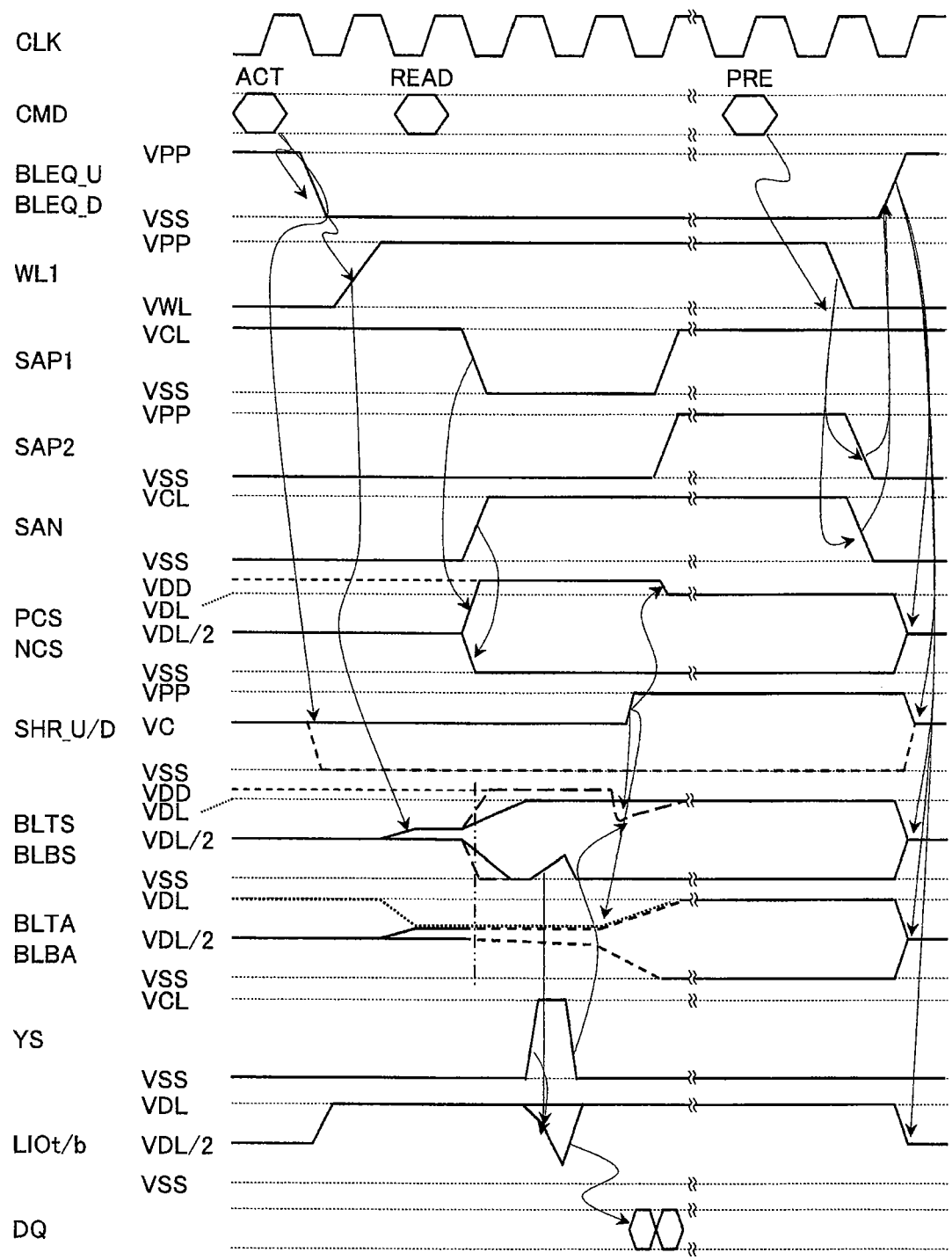
FIG. 18 is a waveform diagram showing a read operation example of the synchronous DRAM applied with the SHRMOS transistor gate voltage 3-value control circuit and the bit line overdrive system in the semiconductor memory device according to the second embodiment of the present invention.

Operation of the memory cell array is described using FIG. 18. FIG. 18 is an example of a read operation waveform diagram of the semiconductor memory device applied with the present invention. When the active command ACT is inputted together with the row address, the address is decoded inside. Thereby, the bit line pre-charge signals BLEQ_U, BLEQ_D transit to the inactivated state in a sense amplifier block of the corresponding address. Here, since the pre-charge circuit BLEQ is configured by NMOS, transition is performed from a high potential level of the activated state, for example, the word line boosting power source VPP or the bit line amplitude voltage VDL to the ground level VSS. Therefore, the pre-charge of the bit line of the corresponding memory cell array stops. And, the gate voltage (SHR_D) of the SHRMOS transistor SHR (in this case, a SHRMOS transistor in a lower portion) of a connection part between the non-selected memory cell array ARY and the sense amplifier transits from the intermediate potential VC of standby to VSS after inputting of the ACT.

Next, a word line WL corresponding to the inputted address is selected. Here, the selected word line activates one word line connected to one memory cell, for example, WL1 in FIG. 17. The word line WL1 to be activated transits from the word line standby level VWL to the word line selection level (the word line boosting power source VPP). Accordingly, in the memory cell MC, the gate of the transistor transits to a selected state, the storage node SN and the bit line are connected and data of the memory cell is read to the bit line. Here, a case in which data of 'H' is stored in the memory cell storage node SN is described. In this case, the bit line has a voltage higher than the pre-charge level as much as charges accumulated in the storage node SN. The intermediate potential VC is set so that a signal is transmitted into the sense amplifier.

After a predetermined period elapsed since the word line is activated, the NMOS sense amplifier activation signal SAN transits from the ground level VSS of the non-selected state to the high potential VDL of the activated state or the word line boosting power source VPP and the NMOS cross couple is activated.

At substantially the same time as or delayed from the SAN, the PMOS sense amplifier activation overdrive signal SAP1 transits from the high potential state VCL of the non-selected state or the word line boosting power source VPP to the ground level VSS of the activated state and the PMOS cross couple is activated. The PMOS side common source line PCS is driven to VDD by the PMOS sense amplifier activation overdrive signal SAP1, and therefore, the gate voltage of the PMOS increases compared with a case in which the overdrive is not performed. Thus, a microscopic signal voltage generated in the bit line is amplified to the bit line amplitude voltage and the sense speed is increased. The column command input waiting state is then obtained in this state. The actual column command can be inputted at the same time as or before the bit line amplitude becomes sufficient amplitude.

Here, an example in which the read command READ is inputted from outside is described. A column address desired to be read is inputted at the same time as the read command READ. When the read command is inputted, the column selection signal YS from the column decoder transits from the ground level VSS of the standby state to the high potential VCL (the bit line amplitude voltage VDL or the like) of the selected state according to the address inputted simultaneously and the activated state is obtained. Thus, the data held in the sense amplifier SA is read to the local IO line LIOt/b. And, when the column selection signal YS transits from the high potential VCL (the bit line amplitude voltage VDL or the like) of the selected state to the ground level VSS of the standby state, the SHRMOS transistor gate voltage control circuit SHR_CTRL operates and transits the SHR voltage from the intermediate potential VC to VPP. At this time, the memory cell array ARY and the sense amplifier array SAA are re-coupled, charges of the bit line in the sense amplifier in an H side move to a memory cell array ARY side, and therefore, potential in the H side of the bit line temporarily lowers. In a case where the potential in the H side of the bit line lowers greatly, there is a possibility that the data read is unsuccessful. So, by using the overdrive system, the lowering of the potential in the H side of the bit line is suppressed as much as possible, and influence on the data read operation is suppressed.

And then, although not shown in diagrams, the data is outputted to outside through the main amplifier and the input/output unit.

Next, operation in a case where the pre-charge command PRE is inputted is described. If the pre-charge command is inputted in the command input waiting state, a selected word line transits to the word line standby level VWL of the non-selected state. Accordingly, the sense amplifier activation signals SAN, SAP2 transit to the non-selected state. After the sense amplifier transits to the inactivated state, the bit line pre-charge signals BLEQ_U, BLEQ_D transit to the activated state and all of bit lines and reference bit lines of the activated memory cell array ARY are set to the bit line pre-charge level. In FIG. 18, the bit line pre-charge level is set to VDL/2 which is ½ of the bit line amplitude voltage. Then, the pre-charge operation is completed.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is usable in manufacturing industry of a semiconductor device, electronic equipment and the like.

What is claimed is:

1. A semiconductor memory device comprising:
   a sense amplifier;
   a plurality of memory cell arrays;
   a shared MOS transistor selecting one of the memory cell arrays arranged on both sides of the sense amplifier; and
   a control circuit controlling operation of the shared MOS transistor,
   wherein the control circuit performs control of setting a gate voltage of the shared MOS transistor from first potential to second potential of a word line boosting power source at sense operation by the sense amplifier, setting the gate voltage of the shared MOS transistor from the second potential to third potential after predetermined time elapsed and returning the gate voltage of the shared MOS transistor from the third potential to the first potential when re-coupling the memory cell arrays and the sense amplifier.

2. The semiconductor memory device according to claim 1, wherein the second potential is set between the first potential and ground potential.

3. The semiconductor memory device according to claim 1, wherein the second potential is set between the first potential and power source voltage.

4. The semiconductor memory device according to claim 1, wherein the third potential is set between the second potential and ground potential.

5. The semiconductor memory device according to claim 1, wherein the third potential is set between the first potential and ground potential.

6. The semiconductor memory device according to claim 1, wherein the third potential is set between the first potential and power source voltage.

7. The semiconductor memory device according to claim 1, wherein data is read by a column selection signal while the gate voltage of the shared MOS transistor is controlled.

8. The semiconductor memory device according to claim 1, wherein the control circuit controls the gate voltage of the shared MOS transistor using a column selection signal.

9. The semiconductor memory device according to claim 1, wherein a bit line overdrive system is adopted.

10. The semiconductor memory device according to claim 9, wherein data is read by a column selection signal while overdriving a bit line.

11. The semiconductor memory device according to claim 9, wherein a bit line overdrive is terminated before termination of the control of the gate voltage of the shared MOS transistor.

12. The semiconductor memory device according to claim 9, wherein a bit line overdrive is terminated after termination of the control of the gate voltage of the shared MOS transistor.

13. A semiconductor memory device comprising:
a sense amplifier;
a plurality of memory cell arrays;
shared MOS transistors selecting one of the memory cell arrays arranged on both sides of the sense amplifier; and
a control circuit controlling operation of the shared MOS transistors,
wherein the control circuit performs control of setting gate voltages of the shared MOS transistors to second potential between first potential of a word line boosting power source and ground potential in a standby state, setting the gate voltages of the shared MOS transistors in a non-selected memory cell array side to the ground potential after command input, setting the gate voltages of the shared MOS transistors in a selected memory cell array side from the second potential to the first potential when re-coupling the memory cell arrays and the sense amplifier and returning gate voltages of a selected side shared MOS transistor and a non-selected side shared MOS transistor to the second potential again in a standby.

14. The semiconductor memory device according to claim 13, wherein the second potential is set between power source voltage and the ground potential.

15. The semiconductor memory device according to claim 13, wherein the control circuit controls respective gate voltages of the shared MOS transistors on both sides of the sense amplifier at different timings.

16. The semiconductor memory device according to claim 13, wherein the control circuit controls the gate voltages of the shared MOS transistors using a column selection signal.

17. The semiconductor memory device according to claim 13, wherein a bit line overdrive system is adopted.

18. The semiconductor memory device according to claim 17, wherein data is read by a column selection signal while overdriving a bit line.

19. The semiconductor memory device according to claim 17, wherein a bit line overdrive is terminated before termination of the control of the gate voltages of the shared MOS transistors.

20. The semiconductor memory device according to claim 17, wherein a bit line overdrive is terminated after termination of the control of the gate voltages of the shared MOS transistors.

* * * * *